United States Patent
Xue et al.

(10) Patent No.: US 11,031,078 B2
(45) Date of Patent: Jun. 8, 2021

(54) SEU STABILIZED MEMORY CELLS

(71) Applicant: Microsemi SoC Corp., San Jose, CA (US)

(72) Inventors: Fengliang Xue, San Jose, CA (US); Fethi Dhaoui, Mountain House, CA (US); Pavan Singaraju, San Jose, CA (US); Victor Nguyen, San Ramon, CA (US); John L. McCollum, Orem, UT (US); Volker Hecht, Barsinghausen (DE)

(73) Assignee: Microsemi SoC Corp., San Jose, CA (US)

( * ) Notice: Subject to any disclaimer, the term of this patent is extended or adjusted under 35 U.S.C. 154(b) by 22 days.

(21) Appl. No.: 16/363,619

(22) Filed: Mar. 25, 2019

(65) Prior Publication Data

US 2020/0286559 A1   Sep. 10, 2020

Related U.S. Application Data

(60) Provisional application No. 62/815,798, filed on Mar. 8, 2019.

(51) Int. Cl.
*G11C 14/00* (2006.01)
*H01L 27/11* (2006.01)
(Continued)

(52) U.S. Cl.
CPC ........ *G11C 14/009* (2013.01); *G06F 11/1068* (2013.01); *G11C 29/52* (2013.01); *H01L 27/1104* (2013.01); *H01L 27/11206* (2013.01); *H01L 27/2436* (2013.01); *H01L 45/1233* (2013.01); *H01L 45/1253* (2013.01); *H01L 45/14* (2013.01); *G11C 13/0038* (2013.01);
(Continued)

(58) Field of Classification Search
CPC ....... G11C 14/009; G11C 29/52; G11C 17/16; G11C 13/0069; G11C 17/18; G11C 2213/79; G11C 13/0064; G11C 13/0038; H01L 27/1104; H01L 27/11206; H01L 45/1233; H01L 45/14; H01L 45/1253; H01L 27/2436
See application file for complete search history.

(56) References Cited

U.S. PATENT DOCUMENTS 4,782,467 A   11/1988   Belt et al.
5,905,290 A   5/1999   Houston
(Continued)

FOREIGN PATENT DOCUMENTS

JP   2018107626       7/2018
JP   2018107626 A     7/2018

OTHER PUBLICATIONS

PCT/US2019/043106, Invitation to Pay Additional Fees and, Where Applicable, Protest Fee, International Searching Authority, dated Nov. 28, 2019.
(Continued)

*Primary Examiner* — Mohammed A Bashar
(74) *Attorney, Agent, or Firm* — Glass and Associates; Kenneth D'Alessandro; Kenneth Glass

(57) ABSTRACT

A single-event-upset (SEU) stabilized memory cell includes a latch portion including a cross-coupled latch, and at least one cross coupling circuit path in the latch portion including a first series-connected pair of vertical resistors.

17 Claims, 12 Drawing Sheets

(51) Int. Cl.

| | |
|---|---|
| *H01L 45/00* | (2006.01) |
| *H01L 27/24* | (2006.01) |
| *G06F 11/10* | (2006.01) |
| *G11C 29/52* | (2006.01) |
| *H01L 27/112* | (2006.01) |
| *G11C 17/18* | (2006.01) |
| *G11C 13/00* | (2006.01) |
| *G11C 17/16* | (2006.01) |

(52) U.S. Cl.
CPC ...... *G11C 13/0064* (2013.01); *G11C 13/0069* (2013.01); *G11C 17/16* (2013.01); *G11C 17/18* (2013.01); *G11C 2213/79* (2013.01)

(56) References Cited

U.S. PATENT DOCUMENTS

| | | | |
|---|---|---|---|
| 7,402,847 | B2 | 7/2008 | Kozicki et al. |
| 8,207,753 | B2 | 6/2012 | Cabanas-Holmen et al. |
| 8,415,650 | B2 | 4/2013 | Greene et al. |
| 9,291,674 | B1 | 3/2016 | Lu et al. |
| 9,368,208 | B1* | 6/2016 | Marshall ............ G11C 14/0081 |
| 2004/0017237 | A1 | 1/2004 | Wood |
| 2006/0209588 | A1 | 9/2006 | Liu et al. |
| 2007/0165446 | A1 | 7/2007 | Oliva et al. |
| 2007/0262787 | A1 | 11/2007 | Chakraborty et al. |
| 2009/0219752 | A1 | 9/2009 | Wissel |
| 2013/0135921 | A1* | 5/2013 | Owada .................. G11C 11/21 365/148 |
| 2017/0179382 | A1 | 6/2017 | McCollum et al. |
| 2017/0221563 | A1 | 8/2017 | Taniguchi et al. |
| 2019/0228825 | A1 | 7/2019 | Hecht et al. |
| 2019/0237139 | A1 | 8/2019 | McCollum et al. |

OTHER PUBLICATIONS

U.S. Appl. No. 16/595,096, filed Oct. 7, 2019, Barry Britton.

Zhang Man et al, "An Adaptive Single Event Upset (SEU)-Hardened Flip-Flop Design", 2019 IEEE International Conference on Electron Devices and Solid-State Circuits ( EDSSC), IEEE, Jun. 12, 2019, pp. 1-3.

PCT/US2019/043106, International Search Report and Written Opinion, dated Mar. 13, 2020.

Yi-Chung Chen et al., "The 3-D Stacking Bipolar RRAM for High Density", IEEE Transactions on Nanotechnology, IEEE Service Center, Piscataway, NJ, US, vol. 11, No. 5, Sep. 1, 2012, pp. 948-956.

* cited by examiner

| | Mode \ Node | VDD (18) | VSS (26) | VBL (46) | VWL (48) | Pbias (28) | Nbias (30) | VB (96) | VPWL (98) |
|---|---|---|---|---|---|---|---|---|---|
| 1 | Normal Operation | 1.5V HiZ | 0V | 0.8V | 0V | 0.8V | 0.8V | 0.8V | 1.5V |
| 2 | Pgm ReRAM in Selected Row (Y/N) | 1V | 1V | 0V/1.8V | 1.3V | 1.8V | 0V | 1.8V | -0.8V |
| 3 | Inhibit Pgm ReRAM Unselected Rows | 1V | 1V | X | 0V | 1.8V | 0V | 1.8V | 1.8V |
| 4 | Erase ReRAM in Selected Row (Y/N) | 1V | 1V | 1.8V/0V | 2.5V | 1.8V | 0V | 0V | 0.5V |
| 5 | Inhibit Erase ReRAM Unselected Rows | 1V | 1V | X | 0V | 1.8V | 0V | 0V | 1.8V |
| 6 | Write Latches Selected Row (0/1) | 0.8V | 0V | 0V/0.8V | 1.5V | 0.4V | 0.4V | 0.8V | 0.8V |
| 7 | Inhibit Write Latches Unselected Rows | 0.8V | 0V | X | 0V | 0.4V | 0.4V | 0.8V | 0.8V |
| 8 | Write all zeros | 0.8V | 0V | 0V | 1.5V | 0.4V | 0.4V | 0.8V | 0.8V |
| 9 | Write PROM ReRAMs to Latches | 0.8V | 0V | 0V | 0V | 0.4V | 0.4V | 0V↑ 0.8V | 0.5V |
| 10 | Read PROM ReRAMs | 0.8V | 0V | 0.4V→ float | 0V to 0.8V↑↓ | 0.8V | 0V | 0.8V | 0.4V |
| 11 | Read Latches Selected Row | 0.8V | 0V | 0.4V→ float | 0V to 0.8V↑↓ | 0.4V | 0.4V | 0.8V | 0.8V |
| 12 | Inhibit Read Latches Unselected Rows | 0.8V | 0V | 0.4V→ float | 0V | 0.4V | 0.4V | 0.8V | 0.8V |

X=Don't Care

FIG. 9

SEU STABILIZED MEMORY CELLS

BACKGROUND

The present invention relates to integrated circuit technology. More particularly, the present invention relates to memory cells for user-configurable integrated circuits and to single-event upset (SEU) stabilized memory cells.

Referring first to FIG. 1, a schematic diagram shows an illustrative memory cell 10 including a cross-coupled latch portion (within dashed lines 12). This memory cell 10 is disclosed in co-pending U.S. patent application Ser. No. 16/249,291, filed on Jan. 16, 2019 and assigned to the same assignee as the present application.

In the cross-coupled latch portion 12, a first p-channel transistor 14 and a first p-channel bias transistor 16 are coupled in series between a first voltage supply node $V_{DD}$ (18) and a first output node 20. A first n-channel transistor 22 and a first n-channel bias transistor 24 are coupled in series between a second voltage supply node $V_{SS}$ (26) and the first output node 20, denoted Out. The gates of the first p-channel transistor 14 and the first n-channel transistor 22 are connected together. The gate of the first p-channel bias transistor 16 is connected to a Pbias voltage source 28 and the gate of the first n-channel bias transistor 24 is connected to a Nbias voltage source 30.

A second p-channel transistor 32 and a second p-channel bias transistor 34 are coupled in series between the voltage supply node $V_{DD}$ (18) and a second output node 36, denoted Out!. A second n-channel transistor 38 and a second n-channel bias transistor 40 are coupled in series between the voltage supply node $V_{SS}$ (26) and the second output node 36. The gates of the second p-channel transistor 32 and the second n-channel transistor 38 are connected together. The gate of the second p-channel bias transistor 34 is connected to the Pbias voltage source 28 and the gate of the second n-channel bias transistor 40 is connected to the Nbias voltage source 30.

The first output node 20 is connected to the common connection of the gates of the second p-channel transistor 32 and the second n-channel transistor 38 through a resistive random-access memory (ReRAM) device 42. ReRAM device 42 is a "virgin" ReRAM device, meaning that it is an identical in every way to a conventional ReRAM device except there is no way to program or erase it so it always remains in the fully erased state in which it was when fabricated. This is a high impedance state, where its resistance is field dependent but is greater than about 10M and generally about 1G. This virgin ReRAM device 42 is very useful in that it provides an extremely high impedance while taking up almost no layout area on the integrated circuit because it can be fabricated on an existing contact or inter-metal via in the integrated circuit structure. The polarity of the ReRAM device 42 does not matter. One non-limiting example of a ReRAM device is described in U.S. Pat. No. 8,415,650 issued Apr. 9, 2013, the entire contents of which are incorporated herein by reference. A ReRAM device is basically two metal plates separated by a solid electrolyte layer. The ReRAM device normally can be programmed by applying a voltage potential having a polarity that will drive metal ions from one of the metal plates into the solid electrolyte layer and erased by applying a voltage potential having a polarity that will drive the metal ions back to the source metal plate.

The second output node 36 is connected to the common connection of the gates of the first p-channel transistor 14 and the first n-channel transistor 22. The connections between the output nodes and the gates of the opposing p-channel and n-channel transistors is well known in the art as cross coupling and results in one of output nodes 20, 36 being in a low logic state while the other output node 20, 36 is in the high logic state. The cross coupling forces each output node to control the gates of the opposing p-channel and n-channel transistors, resulting in a stable state of the cross-coupled latch portion 12 of the memory cell 10. The first and second p-channel and n-channel bias transistors 16, 34, 24, 40 control the amount of current allowed to flow through the first and second p-channel and n-channel transistors 14, 22, 32, 38 of the cross-coupled latch portion 12 of the memory cell 10.

In the convention used herein, memory cells discussed will be considered to be programmed when the first output node 20 is in a high logic state and the second output node 36 is in a low logic state. Conversely, the memory cells discussed herein will be considered to be erased when the first output node 20 is in a low logic state and the second output node 36 is in a high logic state.

A select transistor 44 is used to couple to the first output node 20 to a bit line 46 to read from, and write to, the latch portion 12 of the memory cell 10. The select transistor 44 is shown as being an n-channel transistor but could also be a p-channel transistor. The bit line 46 is associated with all of the memory cells in a column of an array of such memory cells. The gate of the select transistor 44 is connected to a word line 48. The word line 48 is associated with all of the memory cells in a row of an array of such memory cells. Persons of ordinary skill in the art will appreciate that row and column arrangements of the bit line 46 and word line 48 in a memory array of memory cells 10 is customary in the art but may be reversed.

Persons of ordinary skill in the art will appreciate that one or both of the first output node 20 and the second output node 36 may be used to control circuit nodes such as switch transistors used to configure programmable connections between circuit nodes of a user-programmable integrated circuit or inputs of logic elements such as lookup tables (LUTs) which need to be supplied with a predetermined logic level. Such uses of the memory cell 10 and these connections are well understood by persons of ordinary skill in the art and thus are not shown to avoid overcomplicating the disclosure.

SEU immunity is one of critical requirements for FPGA user-programmable integrated circuits employed in space applications. The structure of the cross-coupled latch memory cell 10 is intended to support SEU immunity. The virgin ReRAM 42 is used within a latch to create an RC delay for SEU immunity. In particular, if the first output node 20 is in a high state and a particle strike momentarily pulls it down, the combination of the high resistance of the virgin ReRAM device 42, its capacitance and the capacitance of the gates of the second n-channel and p-channel transistors 32 and 38 provides an RC time delay long enough (longer than the duration of the transient) to prevent the voltage at gates of the second n-channel and p-channel transistors 32 and 38 from dropping quickly enough to turn on the second p-channel transistor 32 and turn off the second n-channel transistor 38. Thus memory cell 10 will hold its state over an SEU event, which can only occur at source/drains (e.g., diffusions of select transistor 44), not at gates. Such SEU immunity is obtained at the expense of the write speed of the memory cell 10, since a write pulse must be applied for a period longer than the aforementioned RC time constant. In applications such as where the cross-coupled latch portion 12 is employed in a memory in a user-configurable circuit this additional programming overhead is not problematic. Such a memory cell having SEU immunity may be called herein an SEU stabilized memory cell.

Test chip results have shown that resistances of the virgin ReRAM device 42 are subject to large variations. In addition, some ReRAM devices 42 may be short circuited and will not provide the desired SEU protection. Another issue is that a virgin ReRAM device 42 may be subject to programming disturb conditions during its life time that will change its resistance and negatively affect the SEU immunity of the circuit in which it is used.

BRIEF DESCRIPTION

According to one aspect of the present invention, a single-event-upset (SEU) stabilized memory cell includes a latch portion including a cross-coupled latch, and at least one cross coupling circuit path in the latch portion including a first series-connected pair of vertical resistors.

According to another aspect of the present invention, a memory cell includes a latch portion including a cross-coupled latch having complementary output nodes, a first cross coupling circuit path including a series-connected pair of virgin resistive random-access memory (ReRAM) devices and a second cross coupling circuit path including a series-connected pair of virgin resistive random-access memory (ReRAM) devices.

According to another aspect of the invention a programmable read-only memory (PROM) portion is coupled to one of the complementary output nodes of the latch portion, the PROM portion including a programmable and erasable ReRAM device.

According to another aspect of the present invention, the programmable and erasable ReRAM device is coupled to one of the complementary output nodes of the latch portion through an access transistor.

According to another aspect of the present invention, the latch portion includes a first p-channel transistor coupled between a first voltage supply node and a first one of the complementary output nodes, a first n-channel transistor coupled between the first one of the complementary output nodes and a second voltage supply node, a second p-channel transistor coupled between the first voltage supply node and the first one of the complementary output nodes, and a second n-channel transistor coupled between the first one of the complementary output nodes and the second voltage supply node. The gates of the first p-channel transistor and the first n-channel transistor are connected together to the second one of the complementary output nodes and gates of the second p-channel transistor and the second n-channel transistor are connected together to the first one of the complementary output nodes.

According to another aspect of the present invention, the gates of the second p-channel transistor and the second n-channel transistor are connected together to the first one of the complementary output nodes through the series-connected pair of virgin ReRAM devices.

According to another aspect of the present invention, the gates of the first p-channel transistor and the first n-channel transistor are connected together to the second one of the complementary output nodes through the series-connected pair of virgin ReRAM devices.

According to another aspect of the present invention, the gates of the second p-channel transistor and the second n-channel transistor are connected together to the first one of the complementary output nodes through a first series-connected pair of virgin ReRAM devices, and the gates of the first p-channel transistor and the first n-channel transistor are connected together to the second one of the complementary output nodes through a second series-connected pair of virgin ReRAM devices.

According to another aspect of the present invention, the first p-channel transistor is coupled between the first voltage supply node and the first one of the complementary output nodes through a first p-channel bias transistor, the first n-channel transistor is coupled between the first one of the complementary output nodes and the second voltage supply node through a first n-channel bias transistor, the second p-channel transistor is coupled between the first voltage supply node and the first one of the complementary output nodes through a second p-channel bias transistor, and the second n-channel transistor is coupled between the first one of the complementary output nodes and the second voltage supply node through a second n-channel bias transistor. The first and second p-channel bias transistors have gates coupled to a Pbias line in the array, and the first and second n-channel bias transistors have gates coupled to a Nbias line in the array.

According to another aspect of the present invention, the memory cell is disposed in an array of memory cells. One of the complementary output nodes of the cross-coupled latch portion is coupled to a bit line in the array through an n-channel access transistor, the n-channel access transistor having a gate coupled to a word line in the array, and the p-channel access transistor has a gate coupled to a PROM word line in the array.

BRIEF DESCRIPTION OF THE DRAWING FIGURES

The invention will be explained in more detail in the following with reference to embodiments and to the drawing in which are shown:

FIG. 9 is a voltage table illustrating typical voltages applied during the different operating modes of the memory cell of the present invention;

Figure 15A:
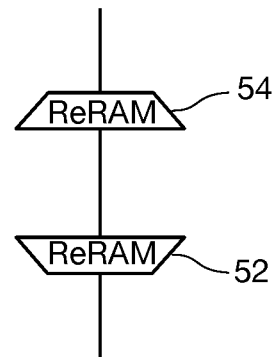
Figure 15B:
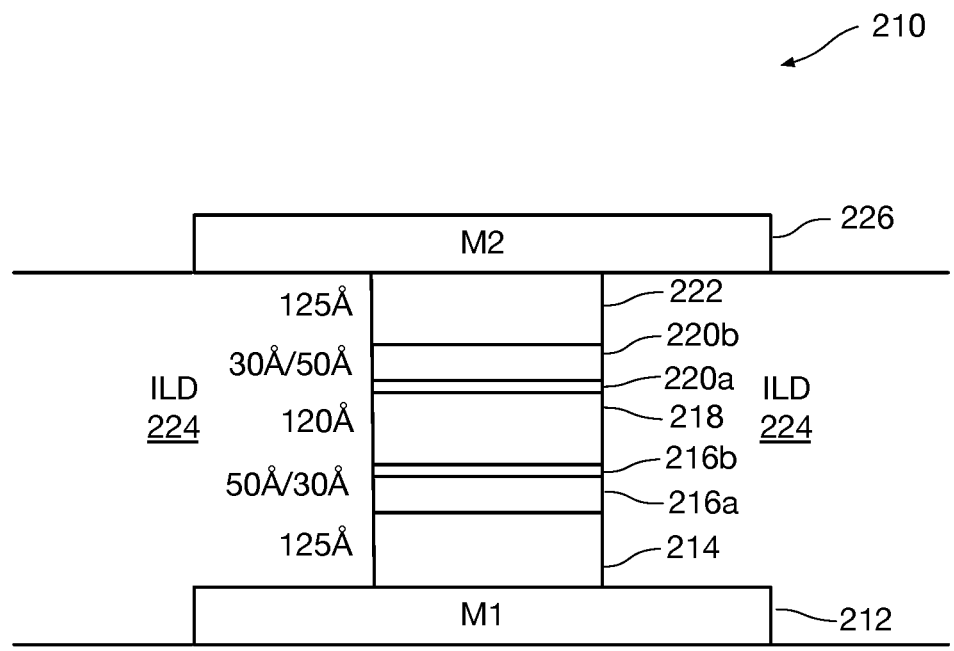

FIGS. 15A and 15B are, respectively, a schematic diagram of a series-connected pair of ReRAM devices and a cross sectional view of the ReRAM devices formed as a stack implemented in silicon in accordance with an aspect of the invention; and FIGS. 16A through 16F are cross-sectional views of the ReRAM stack of FIG. 15B showing selected progressive fabrication steps used to manufacture it as part of a semiconductor fabrication process.

DETAILED DESCRIPTION

Persons of ordinary skill in the art will realize that the following description of the present invention is illustrative only and not in any way limiting. Other embodiments of the invention will readily suggest themselves to such skilled persons.

Figure 1:
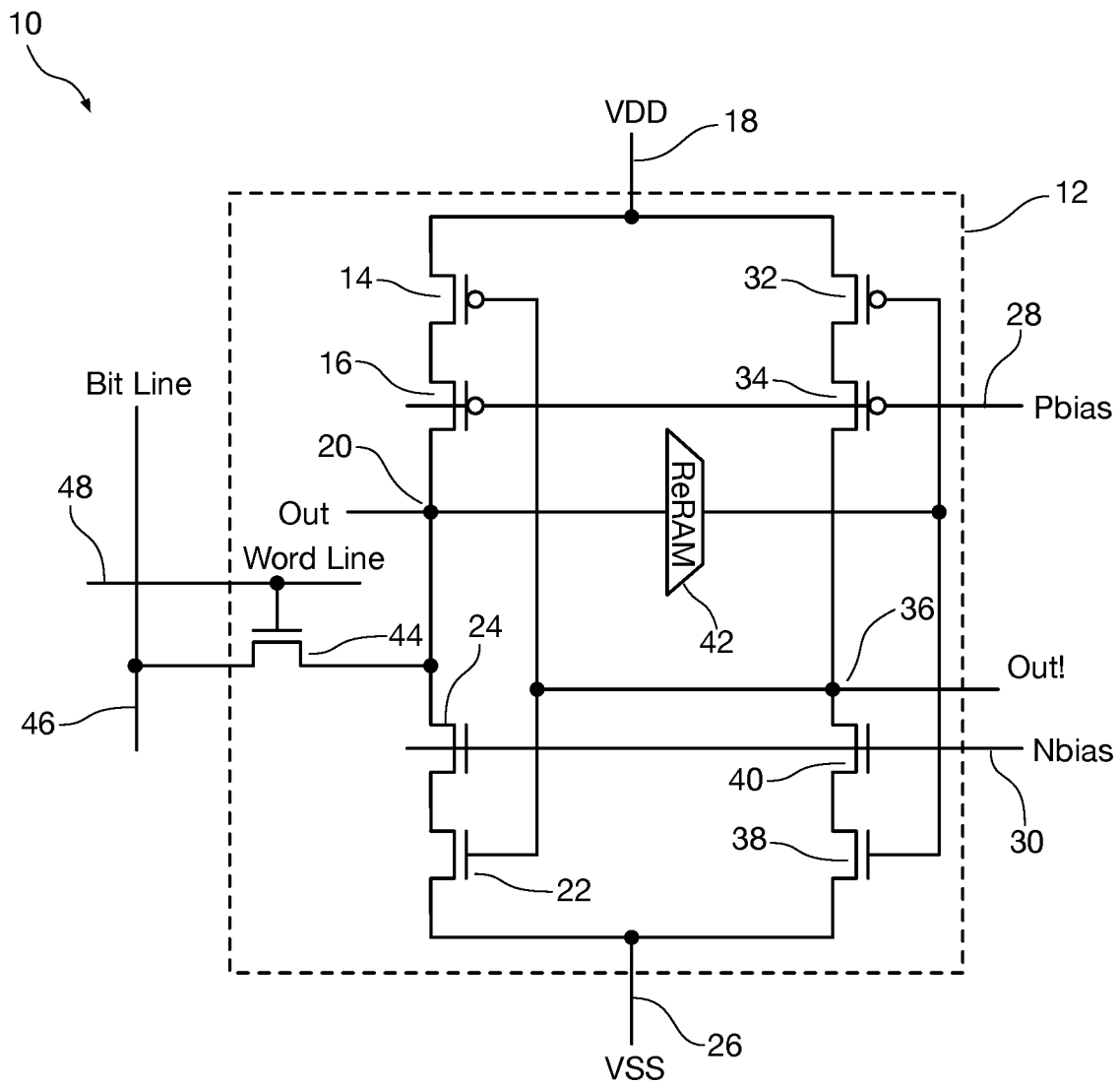
FIG. 1 is a schematic diagram of a cross-coupled latch portion of a memory cell.
Figure 2:
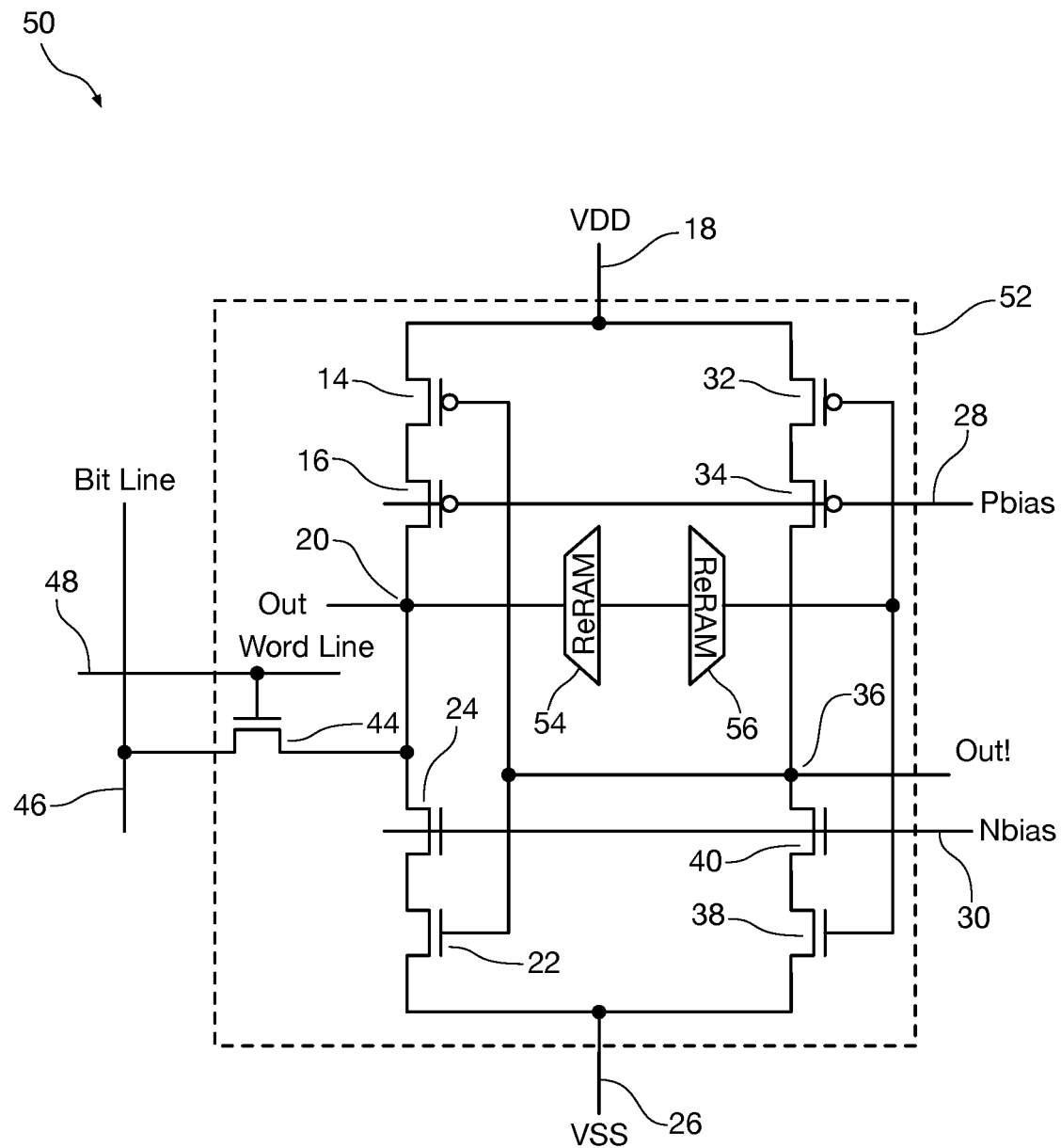
FIG. 2 is a schematic diagram of a cross-coupled latch portion of an SEU stabilized memory cell in accordance with an aspect of the present invention.

Referring now to FIG. 2, a schematic diagram shows an embodiment of a cross-coupled latch portion (within dashed lines 52) of a memory cell 50 in accordance with an aspect of the present invention. The latch portion 52 of the memory cell 50 is similar to latch portion 12 of the memory cell 10 of FIG. 1 and like elements in both circuits will be referred to using the same reference numerals.

In the cross-coupled latch portion 52 of the memory cell 50 of FIG. 2, a first p-channel transistor 14 and a first p-channel bias transistor 16 are coupled in series between a first voltage supply node $V_{DD}$ (18) and a first output node 20, denoted Out. A first n-channel transistor 22 and a first n-channel bias transistor 24 are coupled in series between a second voltage supply node $V_{SS}$ (26) and the first output node 20. The gates of the first p-channel transistor 14 and the first n-channel transistor 22 are connected together. The gate of the first p-channel bias transistor 16 is connected to a Pbias voltage source 28 and the gate of the first n-channel bias transistor 24 is connected to a Nbias voltage source 30.

A second p-channel transistor 32 and a second p-channel bias transistor 34 are coupled in series between the voltage supply node $V_{DD}$ (18) and a second output node 36, denoted Out!. A second n-channel transistor 38 and a second n-channel bias transistor 40 are coupled in series between the voltage supply node $V_{SS}$ (26) and the second output node 36. The gates of the second p-channel transistor 32 and the second n-channel transistor 38 are connected together. The gate of the second p-channel bias transistor 34 is connected to the Pbias voltage source 28 and the gate of the second n-channel bias transistor 40 is connected to the Nbias voltage source 30.

The first output node 20 is connected to the common connection of the gates of the second p-channel transistor 32 and the second n-channel transistor 38 through a series-connected pair of resistive random-access memory (ReRAM) devices 54 and 56.

ReRAM devices 54 and 56 are "virgin" ReRAM devices, as described above in relation to ReRAM device 42. The polarity of the ReRAM devices 54 and 56 is not critical but they occupy the least layout area when they are oriented front-to-front (their ion source regions facing away from one another) or back-to-back (their ion source regions facing towards one another). As will be described further below, ReRAM devices 54 and 56 are particular embodiments of vertical resistors.

The second output node 36 is connected to the common connection of the gates of the first p-channel transistor 14 and the first n-channel transistor 22. The connections between the output nodes and the gates of the opposing p-channel and n-channel transistors is well known in the art as cross coupling and results in one of output nodes 20, 36 being in a low logic state while the other output node 20, 36 is in the high logic state. The cross coupling forces each output node to control the gates of the opposing p-channel and n-channel transistors, resulting in a stable state of the cross-coupled latch portion 12 of the memory cell 10. The first and second p-channel and n-channel bias transistors 16, 34, 24, 40 control the amount of current allowed to flow through the first and second p-channel and n-channel transistors 14, 22, 32, 38 of the cross-coupled latch portion 12 of the memory cell 10.

A select transistor 44 is used to couple to the first output node 20 to a bit line 46 to read from, and write to, the latch portion 12 of the memory cell 10. The select transistor 44 is shown as being an n-channel transistor but could also be a p-channel transistor. The bit line 46 is associated with all of the memory cells in a column of an array of such memory cells. The gate of the select transistor 44 is connected to a word line 48. The word line 48 is associated with all of the memory cells in a row of an array of such memory cells. Persons of ordinary skill in the art will appreciate that row and column arrangements of the bit line 46 and word line 48 in a memory array of memory cells 50 is customary in the art but may be reversed.

Persons of ordinary skill in the art will appreciate that one or both of the first output node 20 and the second output node 36 may be used to control circuit nodes such as switch transistors used to configure programmable connections between circuit nodes of a user-programmable integrated circuit or inputs of logic elements such as lookup tables (LUTs) which need to be supplied with a predetermined logic level. Such uses of the memory cell 50 and these connections are well understood by persons of ordinary skill in the art and thus are not shown to avoid overcomplicating the disclosure.

The memory cell 50 of the present invention provides enhanced SEU protection. In particular, if the first output node 20 is in a high state and a particle strike momentarily pulls it down, the combination of the high resistance of the virgin ReRAM devices 54 and 56, their capacitances and the capacitance of the gates of the second n-channel and p-channel transistors 32 and 38 provides an RC time delay long enough (longer than the duration of the transient) to prevent the voltage at gates of the second n-channel and p-channel transistors 32 and 38 from dropping quickly enough to turn on the second p-channel transistor 32 and turn off the second n-channel transistor 38 during the momentary transient (typically between about 1 nS and 10 nS). Typical RC time constants of a series-connected pair of virgin ReRAM devices and gate capacitance is about 1 µS. During the transient, this RC time delay keeps the gates transistors 14 and 22 feeding node 20 in the states they were in prior to the transient to prevent the cross-coupled latch portion 12 in the memory cell 50 from changing state. Thus memory cell 50 is protected against particle strikes in its high state, with the series-connected pair of virgin ReRAM devices 54 and 56. Those skilled in the art will recognize that erasing memory cell 50 to a low state will require a longer pulse than would be required in the absence of the series-connected pair of virgin ReRAM devices 54 and 56, however memory cell 50 is infrequently reprogrammed or erased so this is not of concern.

The two series-connected ReRAM devices 54 and 56 allow redundancy against ReRAM device shorts and also tightens ReRAM impedance spreads without degrading SRAM speed. Using a back-to-back connection of the two series-connected ReRAM devices 54 and 56 eliminates any ReRAM device disturb conditions. This memory cell 50 thus offers a robust SEU immune solution.

Figure 3:
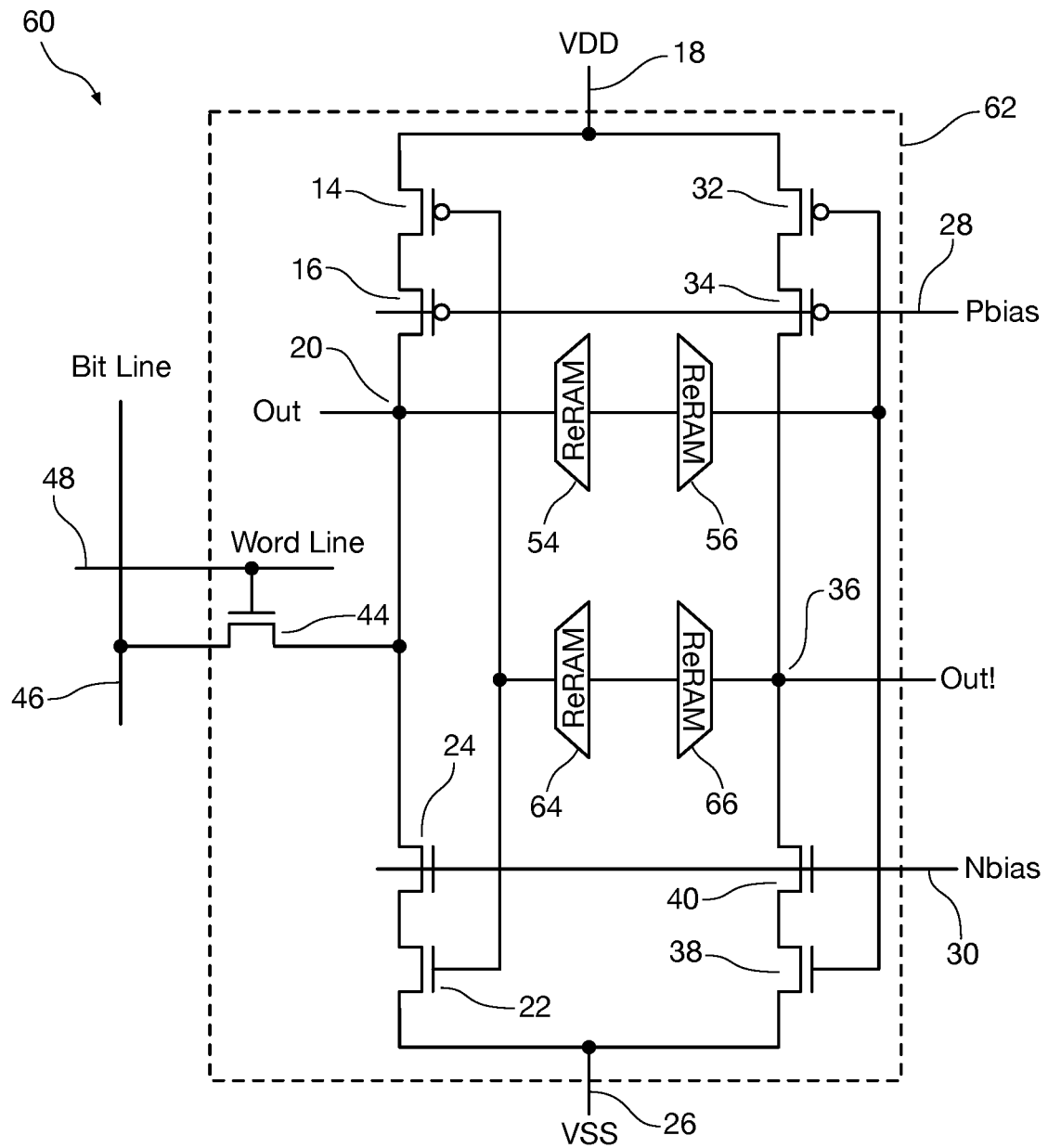
FIG. 3 is a schematic diagram of an alternate embodiment of a cross-coupled latch portion of an SEU stabilized memory cell in accordance with an aspect of the present invention.

Referring now to FIG. 3, a schematic diagram shows an alternate embodiment of a latch portion 62 of a memory cell 60 in accordance with an aspect of the present invention. memory cell 60 is similar to memory cell 50 of FIG. 2 and like elements in both embodiments will be referred to using the same reference numerals.

The difference between the memory cell 60 of FIG. 3 and the memory cell 50 of FIG. 2 is that an additional series-connected pair of virgin ReRAM devices 64 and 66 are employed in the cross-coupled latch portion 62 as compared to cross-coupled latch portion 52. As will be described further below, ReRAM devices 64 and 66 are particular embodiments of vertical resistors. As in memory cell 50 of FIG. 2, in memory cell 60 of FIG. 3 the first output node 20 is connected to the common connection of the gates of the second p-channel transistor 32 and the second n-channel transistor 38 through a first series-connected pair of virgin ReRAM devices 54 and 56. In the embodiment of FIG. 3, the second output node 36 is also connected to the common connection of the gates of the first p-channel transistor 14 and the first n-channel transistor 22 through a second series-connected pair of virgin ReRAM devices 64 and 66.

Persons of ordinary skill in the art will readily appreciate that the two series-connected pairs of virgin ReRAM devices 54 and 56 and 64 and 66 in the embodiment of FIG. 3 function in exactly the same manner as the single series-connected pair of virgin ReRAM devices 54 and 56 in the embodiment of FIG. 2. The use of two series-connected pairs of virgin ReRAM devices 54 and 56 and 64 and 66 in the embodiment of FIG. 3 provides additional redundancy in case one or two of the ReRAM devices 54, 56, 64, and 66 is short circuited due to a manufacturing defect. In addition, the use of additional virgin ReRAM devices 64 and 66 provides symmetrical glitch recovery from both output nodes Out 20 and Out! 36.

In some applications where a transient cannot be tolerated (e.g., controlling the routing path of a clock signal), a filtered output may be taken from the node common to one of the virgin ReRAM devices (56 or 64) and the gates of the transistors in the cross-coupled latch portion 62 (either 32 and 38 or 14 and 22) that it drives. This node is a high-impedance output node but has a greater transient immunity than output nodes 20 and 36.

Figure 4:
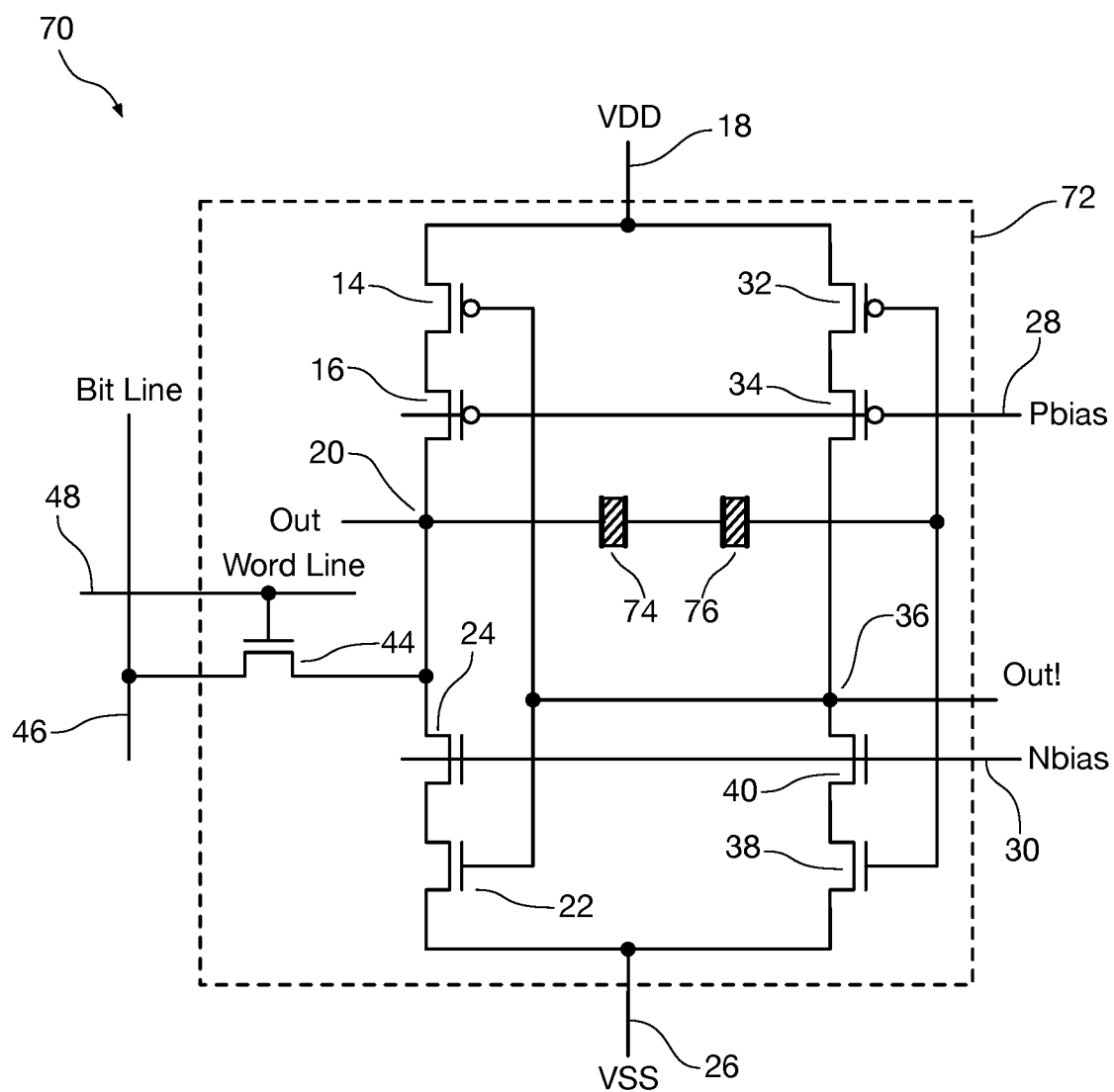
FIG. 4 is a schematic diagram of another alternate embodiment of a cross-coupled latch portion of an SEU stabilized memory cell in accordance with an aspect of the present invention.

Referring now to FIG. 4, a schematic diagram shows another alternate embodiment of a SEU stabilized memory cell 70 including a cross-coupled latch portion 72 in accordance with an aspect of the present invention. The difference between the memory cell 70 of FIG. 4 and the memory cell 50 of FIG. 2 is that the first output node 20 of the cross-coupled latch portion 72 is connected to the common connection of the gates of the second p-channel transistor 32 and the second n-channel transistor 38 through a series-connected pair of vertical resistors 74 and 76, which as indicated above may be embodied as virgin ReRAM devices, or other embodiments of vertical resistors.

Figure 10:
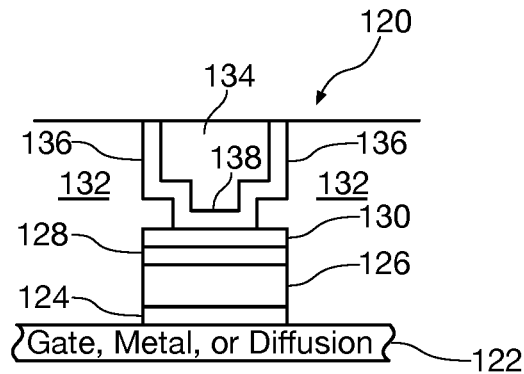
FIG. 10 is a cross-sectional view of an example of an antifuse device structure that may be employed as a vertical resistor in embodiments of the present invention.
Figure 11:
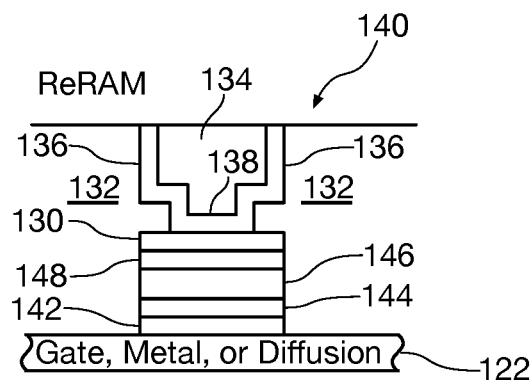
FIG. 11 is a cross-sectional view of an example of a virgin ReRAM device structure that may be employed as a vertical resistor in embodiments of the present invention.

Vertical resistors 74 and 76 are high resistance value-resistors that are formed from successive layers during the semiconductor fabrication process. Vertical resistors typically have resistances in a range from about 1MΩ to about 1GΩ. As will be disclosed herein, vertical resistors 74 and 76 may take any one of several forms. Examples of vertical resistors contemplated for use in the present invention are shown in FIGS. 9 through 11. The symbol at reference numerals 74 and 76 used to designate the vertical resistors will be used to designate all of the several forms taken by the vertical resistor. The operation of the vertical resistors 74 and 76 in providing radiation tolerance to memory cell 70 will be disclosed herein.

The series-connected pair of vertical resistors 74 and 76 stabilizes the memory cell 70 against transient pulses from radiation, as described above in relation to ReRAM devices 54, 56 of the cross-coupled latch portion 52. In a prior-art cross-coupled latch memory cell, a particle strike can cause a transient that will pull down the one of output nodes 20 and 36 that is being held at a high logic level because its p-channel transistor is turned on and its n-channel transistor is turned off from the low logic level at the complementary output node. The high output node that is being pulled down by the particle strike is directly coupled to the gates of both the p-channel transistor and the n-channel transistor coupled in series with the complementary output node that is being held low, this action tends to turn on the p-channel transistor and turn off the n-channel transistor coupled in series with the output node that is being held low. Because of the cross-coupling of the output nodes to the gates of the transistors, the state of the memory cell can easily flip to an erroneous state.

In the memory cell 70 of the present invention, if the first output node 20 is in a high state and a particle strike momentarily pulls it down, the combination of the high resistance of the series-connected pair of vertical resistors 74 and 76, their capacitances and the capacitance of the gates of the second n-channel and p-channel transistors 32 and 38 provides an RC time delay long enough (longer than the duration of the transient) to prevent the voltage at gates of the second n-channel and p-channel transistors 32 and 38 from dropping quickly enough to turn on the second p-channel transistor 32 and turn off the second n-channel transistor 38 during the time the transient is lowering the voltage at the first output node 20 (typically between about 1 nS and 10 nS). Typical RC time constants of a vertical resistor (having a typical resistance on the order of from about 1M ohm to greater than about 1G ohm) in accordance with the present invention and gate capacitance is about 1 μS, thus preventing the output nodes from changing state during the duration of the transient. Thus, memory cell 70 is protected against particle strikes with the series-connected pair of vertical resistors 74 and 76. Those skilled in the art will recognize that erasing memory cell 70 to a low state will require a longer pulse than would be required in the absence of the series-connected pair of vertical resistors 74 and 76, however memory cell 70 is infrequently reprogrammed or erased so this is not of concern.

Figure 5:
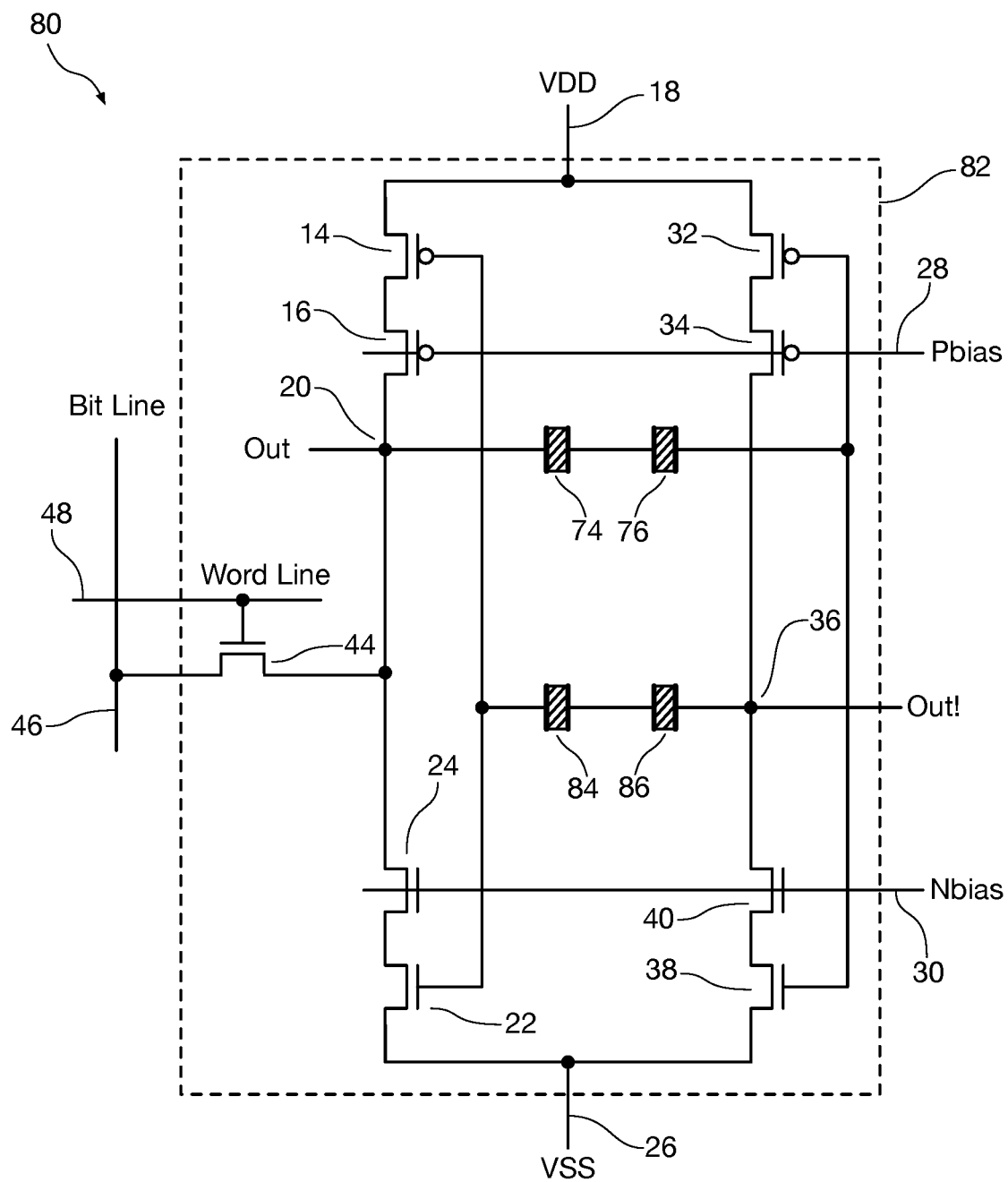
FIG. 5 is a schematic diagram of yet another alternate embodiment of a cross-coupled latch portion of an SEU stabilized memory cell in accordance with an aspect of the present invention.

Referring now to FIG. 5, a schematic diagram shows another alternate embodiment of an SEU stabilized memory cell 80 including a cross-coupled latch portion 82 in accordance with an aspect of the present invention. The memory cell 80 is similar to memory cell 70 of FIG. 4 and like elements in both embodiments will be referred to using the same reference numerals.

The difference between the memory cell 80 of FIG. 5 and the memory cell 70 of FIG. 4 is that an additional series-connected pair of vertical resistors 84 and 86 are employed in the cross-coupled latch 82. As in memory cell 70 of FIG. 4, in memory cell 80 of FIG. 5 the first output node 20 is connected to the common connection of the gates of the second p-channel transistor 32 and the second n-channel transistor 38 through a first series-connected pair of vertical resistors 74 and 76. In the embodiment of FIG. 5, the second output node 36 is also connected to the common connection of the gates of the first p-channel transistor 14 and the first n-channel transistor 22 through a second series-connected pair of vertical resistors 84 and 86. The SEU protection mechanism is the same as is discussed with relation to FIG. 4, but also extends to the second output node 36.

The outputs from memory cells 50, 60, 70, and 80 may be taken from either output node 20 or from output node 36, and there is no requirement that both of the output nodes be made available outside of the memory cells. The disclosure has been made showing the select transistor 44 connected to output node 20 but persons skilled in the art will readily appreciate that the select transistor 44 may be configured to couple the bit lines 46 to the output nodes 36 in some embodiments of the invention.

Figure 6:
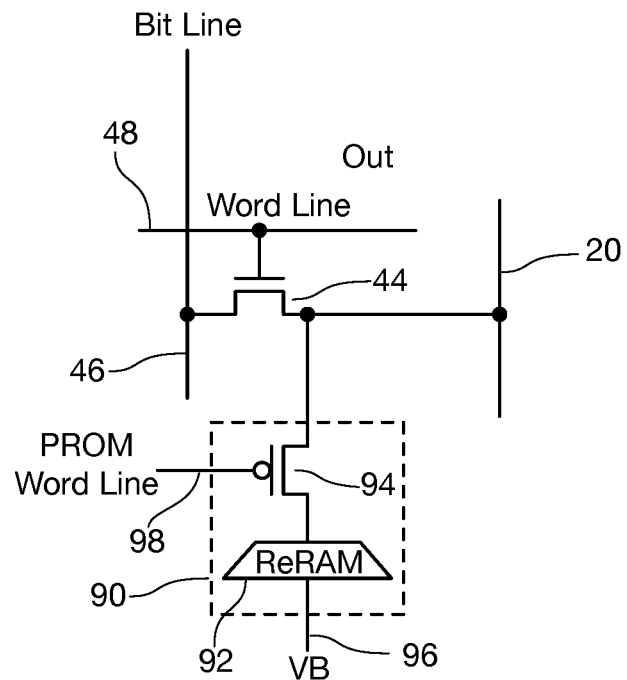
FIG. 6 is a schematic diagram of a ReRAM based PROM cell that may be used in combination with the cross-coupled latch portions of the SEU stabilized memory cells of the present invention.

Referring now to FIG. 6, a schematic diagram shows a ReRAM based programmable read only memory (PROM) cell 90 that may be used in combination with the cross-coupled latch portions of the memory cells of the present invention. In accordance with one aspect of the present invention, the first output node 20 or the second output node 36 of the cross-coupled latch portion 12 of any of the memory cells of the present invention may be coupled to ReRAM based PROM cell 90 that includes a ReRAM device 92 coupled to the output node 20 (or 36) through a PROM select transistor 94. The PROM select transistor 94 is shown as being a p-channel transistor but could also be an n-channel transistor. The ReRAM device 92 is also coupled to a bias voltage source VB (96). The gate of the p-channel PROM select transistor 94 is coupled to a PROM word line shown at reference numeral 98.

The ReRAM based PROM cell 90 may be used to initialize the cross-coupled latch portion 52, 62, 72, and 82 of the memory cell under circuit conditions disclosed herein. Thus, for each cross-coupled latch portion 52, 62, 72, and 82, there is an associated ReRAM based PROM cell 90. As will be described further below, the arrangement allows for data to be loaded into cross-coupled latch 52, 62, 72, and 82 from the associated ReRAM based PROM cell 90 while preferably further providing for the ability to write data directly into the cross-coupled latch portion 52, 62, 72, and 82 in the event of a failure of the associated ReRAM based PROM cell 90.

During "normal operation" of the memory cells 50, 60, 70, or 80 of the present invention (meaning when the respective cross-coupled latch portion 52, 62, 72, or 82 is being used to control one or more circuit nodes in the integrated circuit, as distinguished from programming or erasing operations of the memory cell 50, 60, 70, or 80), it is preferred to supply the $V_{DD}$ voltage node 18 with a voltage source having an output impedance greater than about 10KΩ. Connecting 1.5V to the p+ source of transistors 14 and 32 through a low impedance voltage source is dangerous as this can lead to SCR latch-up. As will be appreciated by persons of ordinary skill in the art, a parasitic PNPN bipolar device is formed from the p+ contact supplying power to the p-channel transistors 14 and 32, the n-well in which they formed, any adjacent p-well containing an n-channel transistor, and the n+ region forming the source or drain of the n-channel transistor in the p-well. This n+ region is normally grounded. A particle strike momentarily forward biasing the junction between the p+ contact supplying power to the p-channel transistor and the n-well in which it is formed, which is typically biased at $V_{DD}$, has the potential to cause SCR latch-up of these parasitic bipolar transistors. Since two Vbe or about 1V is required to cause latch-up, it can be ignored if $V_{DD}$ is less than 1V. It usually requires about 1 mA of current to sustain the latch-up so as to maintain the voltage drop in the wells. Thus, according to one aspect of the present invention, where $V_{DD}$ supplies are providing more than about 1V, it is preferred to apply the $V_{DD}$ voltage with an impedance greater than about 1K), preferably about 10K) to provide a reasonable margin, with the impedance providing a voltage drop sufficient to prevent latch-up. This can be done with a resistor or a transistor, preferably an n-channel transistor.

Figures 7, 8:
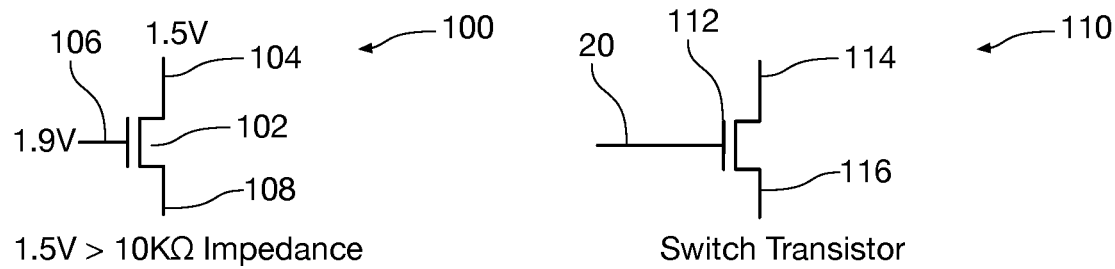
FIG. 7 is a schematic diagram of an exemplary circuit for providing power at a high impedance to the cross-coupled latch portions of memory cells of the present invention.
FIG. 8 is a schematic diagram of an exemplary switch transistor circuit that may be employed when the memory cell of the present invention is used as a configuration memory cell in a user-programmable integrated circuit.

FIG. 7 is a schematic diagram of a circuit 100 that shows the use of an n-channel transistor 102 to provide such a high-impedance voltage source. In an embodiment where it is desired that $V_{DD}$ be 1.5V, the drain 104 of the n-channel transistor 102 is driven from a 1.5V voltage source, the gate 106 of the n-channel transistor 102 is driven from a voltage of 1.9V and the source 108 of the n-channel transistor 102 is used as the $V_{DD}$ voltage supply node 18 of the memory cell 50. It is preferred to use an n-channel transistor 102 configured to provide the above-mentioned desired impedance rather than a p-channel transistor even though a p-channel transistor can supply a constant current when configured as a source follower. Using an n-channel transistor 102 formed in the semiconductor substrate biased above ground prevents the circuit from experiencing SCR latch-up action.

The SEU stabilized memory cells of FIG. 2, FIG. 3, FIG. 4, and FIG. 5 is particularly suited for use as a configuration memory cell to configure circuit functions and interconnect paths in a user-programmable integrated circuit such as an FPGA. In such an application, one of the output nodes Out or Out! 20 or 36 drives a switch transistor 110 (shown as an n-channel transistor) as shown in FIG. 8, where the gate 112 of the switch transistor 110 is shown connected to the Out node 20 of one of the SEU stabilized memory cells 50, 60, 70, or 80 of one of FIG. 2, FIG. 3, FIG. 4, and FIG. 5. The drain 114 and source 116 of the switch transistor 110 form a configurable circuit path that makes a connection when the output node of the SEU stabilized memory cell is in a high logic state.

Referring now to FIG. 9, a voltage table shows representative voltages applied to the SEU stabilized memory cells of the present invention during the various operating modes. The first line of the voltage table of FIG. 9 shows illustrative voltages applied during normal operating mode, i.e. when the cell is used to control a switch transistor. In the voltage table of FIG. 9, the $V_{DD}$ power supply voltage used is 1.5V.

During normal operation of the memory cells of the present invention, a high impedance 1.5V voltage source is coupled to $V_{DD}$ node 16 and the $V_{SS}$ node 24 is at 0V. The bit lines 46 of the memory cells in the array are biased at 0.8V, the common word line 48 of the memory cells is biased at 0V, the common Pbias lines 28 and Nbias lines 30 of the memory cells are biased at 0.8V. This sets the current level through both sides of the memory cell in this exemplary embodiment at about 50 µA during the operating mode. This current level prevents any disturb of the state of the memory cell during a read operation and limits the Vds across all word line select transistors 44 to a maximum of 0.8V.

The VB node 96 for the ReRAM based PROM cells 90 associated with the memory cells is biased at 0.8V and the PROM word line 98 controlling the gates of p-channel PROM select transistors 94 is biased at 1.5V. Under these conditions the select transistors 44 the memory cells are turned off. The PROM select transistors 94 of the memory cells have 1.5V on their gates and are also turned off, disconnecting the PROM ReRAM devices 92 from the first output nodes 20 of the cross-coupled latch portions 12 in the memory cells.

A second line of the voltage table of FIG. 9 shows illustrative voltages applied to program selected ReRAM devices 92 of PROM based ReRAM cells 90 associated with memory cells in a selected row of an array of such memory cells in accordance with an aspect of the present invention.

The ReRAM device 92 of a particular memory cell in the row is to be programmed, i.e. set to its low impedance state, while other ReRAM devices 92 in other memory cells in the selected row are not to be programmed, but are to remain in their previous states.

Accordingly, the $V_{DD}$ node 18 is supplied with 1V at a high impedance, and the $V_{SS}$ node 26 is supplied with 1V. The word line 48 common to the row containing the ReRAM device 92 to be programmed is biased at 1.3V to control programming current. This turns on the select transistors 44 of all of the memory cells in the selected row. The PROM word line 98 common to the row containing the ReRAM device 92 to be programmed is biased at −0.8V, thus turning on the PROM select transistors 94 in that row. The VB line 96 common to one or more memory cells in the array (depending on the architectural preferences of the designer) is biased at 1.8V. The Pbias line 28 common to the row containing the ReRAM device 92 to be programmed is biased at 1.8V, turning off all of the p-channel bias transistors 16 and 34 in the selected row. The Nbias line 30 common to the row containing the ReRAM device 92 to be programmed is biased at 0V, turning off all of the n-channel bias transistors 24 and 40 in the selected row. With both $V_{DD}$ and $V_{SS}$ set to the same voltage (1V) and all of the p-channel and n-channel bias transistors turned off, the cross-coupled latches 12 of the memory cells in the selected row are disabled. The voltages at the first output nodes 20 in the cross-coupled latches 12 of the memory cells in the row to be programmed change as the programming process progresses.

If the bit line 46 in the column containing the ReRAM device 92 to be programmed is set to 0V, that voltage is placed on the first output node 20 of the latch portion 12 of the memory cell containing the ReRAM device 92 to be programmed. This places 1.8V across ReRAM device 92 (1.8V at VB 96 and 0V from the bit line 46 through select transistor 44 and PROM select transistor 94. This causes ReRAM device 92 to draw current, thus programming it to the low impedance state. As the resistance of ReRAM device 92 decreases, the voltage at output node 20 of the memory cell rises towards 1.8V as the ReRAM device 92 reaches its lowest resistance state.

If the bit line 46 in the column containing the ReRAM devices 92 which are not to be programmed is set to 1.8V, that voltage is placed on the first output node 20 of latch portion 12 of the memory cell containing the ReRAM device 92 that is not to be programmed. This places zero volts across ReRAM device 92 (1.8V at VB and 1.8V at first output node 20), which prevents it from being programmed, or erased.

A third line of the voltage table of FIG. 9 shows illustrative voltages applied to memory cells in unselected rows of an array of such memory cells to prevent programming of any ReRAM devices 92 in the unselected rows in accordance with an aspect of the present invention.

In the unselected rows of memory cells, all of the voltage potentials applied to the various circuit nodes are the same as shown in the second line of the voltage table of FIG. 9, with two exceptions. The PROM word lines 98 common to the unselected rows is biased at 1.8V. This turns off all of the p-channel PROM select transistors 94 in the unselected rows. The 0V applied to Word line 48 turns off all of the n-channel select transistors 44 in the unselected rows, leaving the first output nodes 20 of all of the cross-coupled latch portions of the memory cells in the unselected rows floating. No voltage potential is applied across any of ReRAM devices 92 in the unselected rows and thus prevents programming, or erasing, of any ReRAM devices 92 in the unselected rows.

A fourth line of the voltage table of FIG. 9 shows illustrative voltages applied to erase selected ReRAM devices 92 associated with memory cells in a selected row of an array of such memory cells in accordance with an aspect of the present invention.

The $V_{DD}$ node 18 is supplied with 1V at a high impedance, and the $V_{SS}$ node 26 is supplied with 1V. The word line 48 common to the row containing ReRAM devices 92 to be erased is biased at 2.5V. The VB line 96 connected to the ReRAM devices 92 to be erased is biased at 0V. The Pbias line 28 common to the row containing ReRAM devices 92 to be erased is biased at 1.8V, turning off all of the p-channel bias transistors 16 and 34 in that row. The Nbias line 30 common to the row containing ReRAM devices 92 to be erased is biased at 0V, turning off all of the n-channel bias transistors 24 and 36 in that row. With both $V_{DD}$ and $V_{SS}$ set to the same voltage (1V) and all of the p-channel and n-channel bias transistors turned off, all of the cross-coupled latches 12 of the memory cells are disabled.

The word line 48 common to the row containing ReRAM devices 92 to be erased is biased at 2.5V. The PROM word line 98 common to the row containing ReRAM devices 92 to be erased is biased at 0.5V. Under these conditions the select transistors 44 in the selected row are turned on as are the PROM select transistors 98 coupled to the ReRAM devices 92 in the selected row.

Setting the bit line 46 in the column containing the ReRAM device 92 to be erased to 1.8V, that voltage is placed on the first output node 20 of the latch portion 52, 62, 72, or 82 of the memory cell associated with the ReRAM devices 92 to be erased. This places 1.8V across ReRAM devices 92 to be erased (0V at VB and 1.8V at first output node 20 responsive to bit line 44 through select transistor 44). This causes ReRAM device 92 to draw current, thus erasing it. As the resistance of ReRAM device 92 increases, the voltage at output node 20 of the memory cell associated with the ReRAM devices 92 rises from the 0V at VB node 96, eventually reaching 1.8V as the ReRAM device 92 reaches its highest resistance state and stops drawing appreciable current. Persons of ordinary skill in the art will appreciate that the polarity of this erase voltage is opposite to the polarity of the voltage applied for programming as shown in the second line of the table of FIG. 9.

Setting the bit line 46 in the column containing the ReRAM device 92 to 0V, that voltage is placed on the first output node 20 of the latch portion 52, 62, 72, or 82 of the memory cell through its select transistor 44. This places zero volts across ReRAM device 92 (0V at VB and 0V at first output node 20), which prevents it from being erased.

A fifth line of the voltage table of FIG. 9 shows illustrative voltages applied to memory cells in unselected rows of an array of such memory cells to prevent erasing of any ReRAM devices 92 in the unselected rows in accordance with an aspect of the present invention.

In the unselected row of memory cells, all of the voltage potentials applied to the various circuit nodes are the same as shown in the fourth line of the table of FIG. 9, with two exceptions. The PROM word lines 98 common to the unselected rows are biased at 1.8V. This turns off all of the PROM select transistors 94 in the unselected rows. The 0V applied to word line 48 turns off all of the n-channel select transistors 44 in the unselected rows, leaving the first output nodes 20 of all of the latch portions 52, 62, 72, or 82 in the unselected rows floating. This results in no voltage potential being applied across any of ReRAM devices 92 in the unselected rows and prevents erasing of any ReRAM devices 92 in the unselected rows.

A sixth line of the voltage table of FIG. 9 shows illustrative voltages applied to memory cells in selected rows of an array of such memory cells to write to a cross-coupled latch portion in the memory cell accordance with the present invention, without reference to the data stored in the associated ReRAM based PROM cell 90.

The $V_{DD}$ node 18 is supplied with 0.8V at a high impedance, and the $V_{SS}$ node 26 is supplied with 0V. The word line 48 common to the selected row is biased at 1.5V. The PROM word line 98 common to the selected row is biased at 0.8V. The VB line 96 connected to the memory cell is biased at 0.8V. The Pbias line 28 common to the selected row is biased at 0.4V. The Nbias line 28 common to the selected row is biased at 0.4V. This allows all of the p-channel bias transistors 16 and 34 and n-channel bias transistors 24 and 40 in the selected row to pass about 1 μA of current.

Under these conditions the select transistors 44 in the selected row are turned on and the PROM select transistors 94 coupled to the ReRAM devices 92 in the selected row are turned off.

Setting the bit line 46 in the column containing the latch portion 52, 62, 72, or 82 of the memory cell to be written to 0V, that voltage is placed on the first output node 20 of the latch portion 52, 62, 72, or 82. The voltage at the gates of the second p-channel transistor 32 and the second n-channel transistor 38 drop to 0V with a delay equal to the time constant of the resistance of vertical resistors 74 and 76, which as indicated above may be implemented by virgin ReRAM devices 54 and 56 of FIG. 2, and the combined capacitance of the gates of the second p-channel transistor 32 and the second n-channel transistor 38. As the voltage at the gates of the second p-channel transistor 32 and the second n-channel transistor 38 drops, the second p-channel transistor 32 turns on as the second n-channel transistor 38 turns off. This action pulls the second output node 36 up to 0.8V, i.e. to $V_{DD}$, turning off the first p-channel transistor 14 and turning on the first n-channel transistor 22, the first output node 20 down to zero volts to complete writing the cross-coupled latch portion 12 to a logic zero state.

If the bit line 46 in the column containing the latch portion 12 of the memory cell to be written is set to 0.8V, that voltage is placed on the first output node 20 of the latch portion 12. The voltage at the gates of second p-channel transistor 32 and second n-channel transistor 38 rise to 0.8V with a delay equal to the time constant of the resistance of vertical resistors 74 and 76, which as indicated above may be implemented by virgin ReRAM devices 54 and 56 and the combined capacitance of the gates of the second p-channel transistor 32 and the second n-channel transistor 38. As the voltage at the gates of the second p-channel transistor 32 and the second n-channel transistor 38 rise, the second p-channel transistor 32 turns off and the second n-channel transistor 38 turns on. This action pulls the second output node 36 down to 0V, turning on the first p-channel transistor 14 and turning off the first n-channel transistor 22, pulling the first output node 20 up to 0.8V volts to write the cross-coupled latch portion 52, 62, 72, or 82 of the memory cell to a logic one state.

A seventh line of the voltage table of FIG. 9 shows illustrative voltages applied to memory cells in unselected rows of an array of such memory cells to inhibit write to cross-coupled latches in the memory cells in the unselected rows in accordance with the present invention.

The voltages applied to the memory cells in the seventh line of the voltage table of FIG. 9 are the same as those applied in the sixth line of the voltage table of FIG. 9, except that the voltage at word line 48 common to all memory cells in the unselected row is set to 0V. Because the select transistors 44 are turned off, the voltages at the bit lines 46 are not transferred to the first output nodes 20 of any of the latch portions 12 of the memory cells preventing writing to any of the cross-coupled latch portions 52, 62, 72, or 82 in the unselected rows.

An eighth line of the voltage table of FIG. 9 shows illustrative voltages applied to memory cells to write zeros, i.e. to erase, at startup to the latch portion 12 of all memory cells in a row of the array in accordance with the present invention.

To perform this write operation, the $V_{DD}$ node 18 is supplied with 0.8V at a high impedance, and the $V_{SS}$ node 26 is supplied with 0V. All bit lines 46 are set to 0V.

The word line 48 common to the row is biased at 1.5V, turning on all select transistors 44. The PROM word line 98 common to the row is biased at 0.8V turning off all PROM select transistors 94. The VB line 96 associated with the row is biased at 0.8V. The Pbias line 28 common to the row is biased at 0.4V. The Nbias line 30 common to the row is biased at 0.4V. This allows all of the p-channel bias transistors 14 and 32 and n-channel bias transistors 22 and 28 to pass about 1 μA of current.

With the bit lines 46 at 0V and select transistors 44 turned on, 0V is placed on the first output nodes 20 of all of the latch portions 12 in the row. After an RC time delay from the resistance of the vertical resistors 74 and 76, which as indicated above may be implemented by virgin ReRAM devices 54 and 56 in combination with the combined capacitances of the p-channel transistor 32 and the n-channel transistor 38, the second output nodes 36 drop to 0V turning on the p-channel transistors 32 and turning off the n-channel transistors 38. This action pulls second output nodes 36 up to 0.8V, turning off the first p-channel transistors 14 and turning on the first n-channel transistors 22, thus writing all of the cross-coupled latch portions 12 portions of the memory cells in the selected row to a zero-logic state.

A ninth line of the voltage table of FIG. 9 shows illustrative voltages applied to memory cells to write the contents of all of the ReRAM based PROM cells 90 in all rows into the cross-coupled latches 12 of the memory cells.

After performing the all-cell zero-write procedure described above with reference to the eighth line of the table in FIG. 9, the contents of all of the ReRAM based PROM cells 90 in all rows are now written into the cross-coupled latches 12 of their associated memory cells. The V$_{DD}$ node 18 is supplied with 0.8V at a high impedance, to minimize stress on the transistor source drains, and the V$_{SS}$ node 26 is supplied with 0V. The bit lines 46 are set to 0V.

The word line 48 common to the row containing memory cells to be loaded with the contents of the associated ReRAM based PROM cell 90 is biased at 0V, turning off all select transistors 44. The PROM word line 98 common to the row is biased at 0.5V turning on all PROM select transistors 94 in that row to a level that limits the current through them to approximately 10 μA or limits the voltage across them to about 0.4V. The Pbias line 28 common to all rows containing memory cells is biased at 0.4V. The Nbias line 30 common to all rows is biased at 0.4V. This allows all of the p-channel bias transistors 16 and 34 and all of the n-channel bias transistors 24 and 40 to pass about 1 μA of current.

After all of these voltage potentials have been applied, the VB line 96 connected to all of the cells in the array or block to be written is ramped from 0V to 0.8V. This causes the voltage at the first output node 20 in memory cells whose PROM ReRAMs have been programmed to their ON states to rise. After the delay through the virgin ReRAM devices 54 and 56, the voltage at the common gates of the second p-channel transistors 32 and second n-channel transistors 38 rises, turning off the second p-channel transistors 32 and turning on the second n-channel transistors 38, pulling down the second output node 36. This pulls down the voltage at the common gates of the first p-channel transistors 14 and second n-channel transistors 22, turning on the first p-channel transistors 14 and turning off the first n-channel transistors 22 thus latching the voltage on first output nodes 20 to program the configuration memory cells to a logic one state.

The voltages at the first output nodes 20 of the memory cells whose PROM ReRAM devices 92 have been erased to their OFF states, i.e. their high impedance state, do not change from 0V because even though the voltage at the VB line 96 rises, the PROM ReRAM devices 92 are erased to their OFF states. Thus, these memory cells remain in the logic zero state set as described in relation to the eighth line.

A tenth line of the voltage table of FIG. 9 shows illustrative voltages applied to memory cells to verify (read) the states of a plurality of the PROM ReRAM devices 92 after the write procedure disclosed with reference to the second line of the voltage table of FIG. 9 has been performed in accordance with an aspect of the present invention.

The V$_{DD}$ node 18 is supplied with 0.8V, optionally at a high impedance, and the V$_{SS}$ node 26 is supplied with 0V. The PROM word line 98 common to the row containing memory cells whose PROM ReRAM devices 92 states are to be verified is biased at approximately 0.4V turning on all PROM select transistors 94 in that row. The VB line 96 associated with the selected row in the array is biased at 0.8V. The Pbias line 28 common to the row containing memory cells 50, 60, 70, or 80 whose states are to be verified is biased at 0.8V. The Nbias line 28 common to the row containing memory cells whose states are to be verified is biased at 0V. This turns off all of the p-channel bias transistors 16 and 34 and the n-channel bias transistors 24 and 40 in the selected row so that no currents from the latch portion 52, 62, 72, or 82 will be present to disturb the reading of the ReRAM state. At this point the states of the cross-coupled latches 52, 62, 72, or 82 in the array are indeterminate but will be programmed later from the PROMs.

The bit lines 46 are precharged to 0.4V, i.e, a midpoint voltage, and then the word line 48 common to the selected row is raised from 0V to 0.8V, turning on the word line select transistors 44 in the selected row. If the ReRAM in the cell is programmed, the bit line 46 will be pulled up towards the 0.8V on VB. If the ReRAM is not programmed the bit line will stay floating at 0.4V.

An eleventh line of the voltage table of FIG. 9 shows illustrative voltages applied to memory cells 50, 60, 70, or 80 to read the states of a plurality of the cross-coupled latch portions in the memory cells in a selected row of the array.

The V$_{DD}$ node 18 is supplied with 0.8V, and the V$_{SS}$ node 28 is supplied with 0V. The Pbias line 28 is biased at 0.4V. The Nbias line 30 is biased at 0.4V. This sets the current level through both sides of the cross-coupled latch portions 52, 62, 72, 82 of the memory cells in this exemplary embodiment at about 50 μA during this procedure.

The PROM word line 98 common to the row containing memory cells 50, 60, 70, or 80 whose states are to be read is biased at 0.8V turning off all PROM select transistors 94. The VB line 96 is biased at 0.8V. Bit lines 46 are precharged to 0.4V and then allowed to float. The word line 48 common to the row containing memory cells 50, 60, 70, or 80 whose latch portion states are to be read is raised from 0V to 0.8V, gradually turning on all select transistors 44 in the selected row.

As the voltage on the word line 48 is ramped up, select transistors 44 turn on. The turning on of select transistors 44 connected to latch portions 52, 62, 72, 82 of memory cells 50, 60, 70, or 80 that are storing low logic levels causes the 0.4V floating voltage on the bit line 46 to discharge down towards the 0V level present on the first output node 20. The turning on of select transistors 44 connected to latch portions 52, 62, 72, 82 of memory cells 50, 60, 70, or 80 that are storing high logic levels causes the 0.4V floating voltage on the bit lines 46 to charge up towards the 0.8V level present on the first output node 20.

After the voltages on all the bit lines 46 have been allowed to settle to their driven values, the voltage on the word line 48 is brought back to 0V to turn off the select transistors 44. The voltages on the bit lines 46 can then be sensed using suitable sense amplifier circuits.

A twelfth line of the voltage table of FIG. 9 shows illustrative voltages applied to memory cells to inhibit reading of the states of the cross-coupled latches 52, 62, 72, 82 in the memory cells 50, 60, 70, or 80 in unselected rows of the array.

The voltage potentials applied to the memory cells in unselected rows of memory cells 50, 60, 70, or 80 are the same as the voltages applied as shown in the eleventh line of the table of FIG. 9, except that the word lines 48 of unselected rows are biased at 0V, thus keeping select transistors 44 turned off in the unselected rows. This is necessary to avoid more than one row of memory cells competing for control of the bit lines 46.

Referring now to FIG. 10, a cross-sectional view shows the structure of a representative unprogrammed antifuse device that may be employed as one form of a vertical resistor in embodiments of the present invention. The unprogrammed antifuse device 120 is formed over one of a transistor gate, metal interconnect layer, or diffusion in a substrate or well (shown as layer 122). Layer 124 is a lower electrode of the antifuse device 120, layer 126 is a layer of antifuse material formed over the lower electrode 124 and which may be formed from a material such as doped or undoped amorphous silicon. An upper electrode 128 is formed over the antifuse material 126. The layers 124, 126, and 128 may then be etched as a stack. In some embodiments, layer 122 may be used as an etch stop layer and in other embodiments a separate etch-stop layer (not shown) may be formed over layer 122. In some embodiments, a diffusion barrier layer 130 is also formed on and etched with the stack.

A dielectric layer 132 is then formed over the stack of layers 124, 126, and 128 and a metal layer is formed and connected to the top layer (130 or 128) of the stack. In FIG. 10, the metal layer is shown as a damascene copper layer 134 surrounded by a liner 136 as is known in the art. Prior to formation of the liner 136 and the copper metal line 134, a via 138 is formed to make connection to the top layer 128 or 130 of the antifuse as is known in the art.

Antifuse devices such as the one described above are well known. One non-limiting illustrative example of an antifuse device 120 is shown in U.S. Pat. No. 5,770,885, the entire contents of which are incorporated herein by reference. The antifuse device 120, particularly layers 124, 126, and 128, remains unprogrammed, and in this state has a resistance on the order of from about 1M ohm to greater than about 1G ohm.

Referring now to FIG. 11, a cross-sectional view shows the structure of a representative virgin ReRAM device structure 140 that may be employed as another form of a vertical resistor in embodiments of the present invention. This form of a vertical resistor (54, 56, 64, and 66 of the prior figures) is very useful in that it provides an extremely high impedance while taking up almost no layout area on the integrated circuit because it can be fabricated on an existing contact or inter-metal via in the integrated circuit structure. The polarity of the ReRAM device does not matter.

Some of the structural elements shown in the embodiment of FIG. 11 are similar to some of the structural elements depicted in FIG. 10. Accordingly, elements present in FIG. 11 that correspond to elements in FIG. 10 will be designated using the same reference numerals as used in FIG. 10.

An unprogrammed ("virgin") ReRAM device 140 is formed over one of a transistor gate, metal interconnect layer, or diffusion in a substrate or well (shown as layer 122). Layer 142 is a diffusion barrier and/or adhesion layer. Layer 144 is a lower electrode of the virgin ReRAM device 140. Layer 146 is a solid electrolyte layer formed over the lower electrode 144. An upper electrode 148 is formed over the solid electrolyte layer 146. In some embodiments, a diffusion barrier layer 130 is also formed above upper electrode 148. The layers 142, 144, 146, 148, and 130 (if present) may then be etched as a stack. In some embodiments, layer 122 may be used as an etch stop layer and in other embodiments a separate etch-stop layer (not shown) may be formed over layer 122.

As in the embodiment of FIG. 10, a dielectric layer 132 is then formed over the stack of layers 142, 144, 146, and 148 and a metal layer is formed and connected to the top layer (130 or 148) of the stack. In FIG. 11, the metal layer is shown as a damascene copper layer 134 surrounded by a liner 136 as is known in the art. Prior to formation of the liner 136 and the copper metal line 134, a via 138 is formed to make connection to the top layer 148 or 130) of the virgin ReRAM device 140 as is known in the art.

Figure 12:
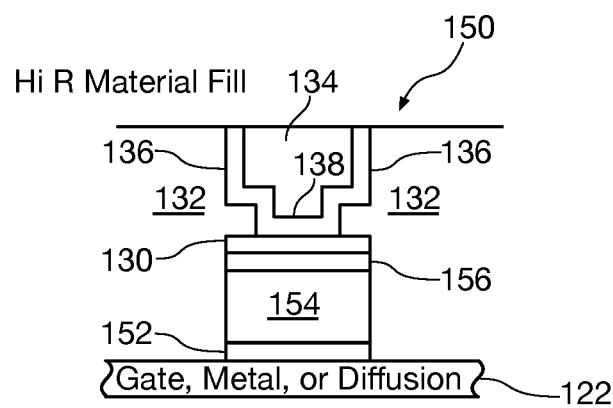
FIG. 12 is a cross-sectional view of another example of a high-resistance structure that may be employed as a vertical resistor in embodiments of the present invention.

Referring now to FIG. 12, a cross-sectional view shows the structure of another representative high-resistance device 150 that may be employed as a vertical resistor in embodiments of the present invention. Some of the structural elements shown in the embodiment of FIG. 12 are similar to some of the structural elements depicted in FIG. 10 and FIG. 11. Accordingly, elements present in FIG. 12 that correspond to elements in the embodiments of FIG. 10 and FIG. 11 will be designated using the same reference numerals as used in those drawing figures.

The high-resistance device 150 is formed over one of a transistor gate, metal interconnect layer, or diffusion in a substrate or well (shown as layer 122). Layer 152 is a diffusion barrier and/or adhesion layer. Layer 154 is layer of high-resistance material formed over layer 152. A second diffusion barrier layer 156 is formed over the layer of high-resistance material 154. In some embodiments, an additional diffusion barrier layer 130 (as in the structures of FIGS. 10 and 11) is also formed on second diffusion barrier layer 156. The layers 152, 154, 156, and 130 (if present) may then be etched as a stack. In some embodiments, layer 122 may be used as an etch stop layer and in other embodiments a separate etch-stop layer (not shown) may be formed over layer 122.

As in the embodiment of FIG. 10 and FIG. 11, a dielectric layer 132 is then formed over the stack of layers 152, 154, 156, and 130 and a metal layer is formed and connected to the top layer (130 or 156) of the stack. In FIG. 12, the metal layer is shown as a damascene copper layer 134 surrounded by a liner 136 as is known in the art. Prior to formation of the liner 136 and the copper metal line 134, a via 138 is formed to make connection to the top layer 156 or 130 of the high-resistance device as is known in the art.

Numerous materials may be employed to form the high-resistance layer 154. A non-exhaustive list includes silicon-rich $SiO_2$, tantalum-rich $Ta_2O_5$, titanium-rich $TiO_2$, aluminum-rich $Al_2O_3$, silicon-rich SiN. Such films can be formed using CVD, PECVD and other deposition processes. Other process-compatible stable high-resistance materials will readily suggest themselves to persons of ordinary skill in the art. The thicknesses and chemical compositions of these materials and the deposition conditions necessary to deposit them to produce desired values of resistance can be easily determined experimentally for employment in particular embodiments of the present invention. These design parameters are easily tailored by persons of ordinary skill in the art to achieve a resistance value of from about 1M ohm to greater than 1G ohm.

Persons of ordinary skill in the art will appreciate that, while a damascene copper metallization structure is shown in FIGS. 10-12, other types of metallization layers may be employed instead. Such skilled persons will readily understand how to integrate such other metallization schemes into the present invention.

Figure 13:
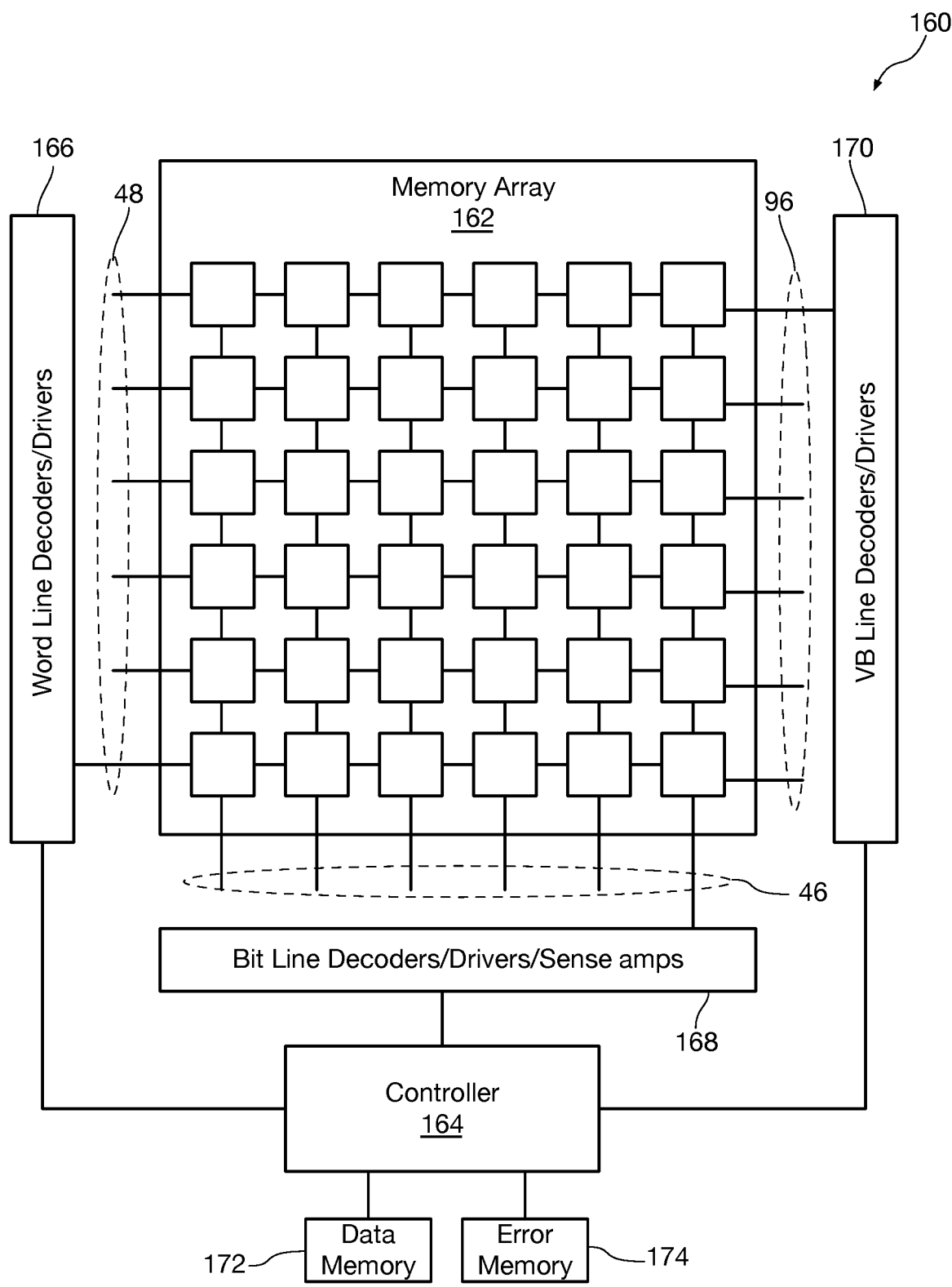
FIG. 13 is a block diagram illustrating features of an array of SEU stabilized memory cells in accordance with an aspect of the invention.

Referring now to FIG. 13, a block diagram shows features of an architecture 160 including an array 162 of SEU stabilized memory cells 50, 60, 70, or 80 in accordance with an aspect of the invention. A controller 164 is coupled to word line decoders/drivers 166, bit line decoders/drivers/sense amplifiers 168, and VB line decoders/drivers 170. A data memory 172 is coupled to the controller 164 for holding data to be written into the memory cells (depicted as small squares representing any one of memory cells 50, 60, 70, and 80 of the various embodiments depicted herein). An error memory 174 holds the locations of known defective memory cells in the array 162 and preferably a copy of the correct data for those locations.

The word line decoders/drivers 166 are controlled by the controller 164 to provide the voltages necessary to drive the word lines 48 of the memory cells for the various operating modes of the array in accordance with the voltage table of FIG. 9. The bit line decoders/drivers/sense amplifiers 168 are controlled by the controller 164 to provide the voltages necessary to drive the bit lines 46 of the memory cells for the various operating modes of the array in accordance with the voltage table of FIG. 9 as well as to sense the contents of the memory cells in accordance with several of the operating modes shown in the table of FIG. 9.

The VB line decoders/drivers provide the voltages necessary to drive the VB lines 96 of the memory cells in accordance with the voltage table of FIG. 9. Persons skilled in the art will appreciate that, while FIG. 13 shows a per row control of the VB lines 96, they can be grouped according to rows of the memory array 162, blocks of the memory array 162, or globally for the entire array in accordance with decisions made by the memory array designer.

Given the disclosure of the operating modes of the memory cells described herein, persons skilled in the art will readily be able to configure a controller 164 for any particular array contemplated within the scope of the present invention. The controller is particularly configured to perform the method described with reference to FIG. 14, to which attention is now drawn.

Figure 14:
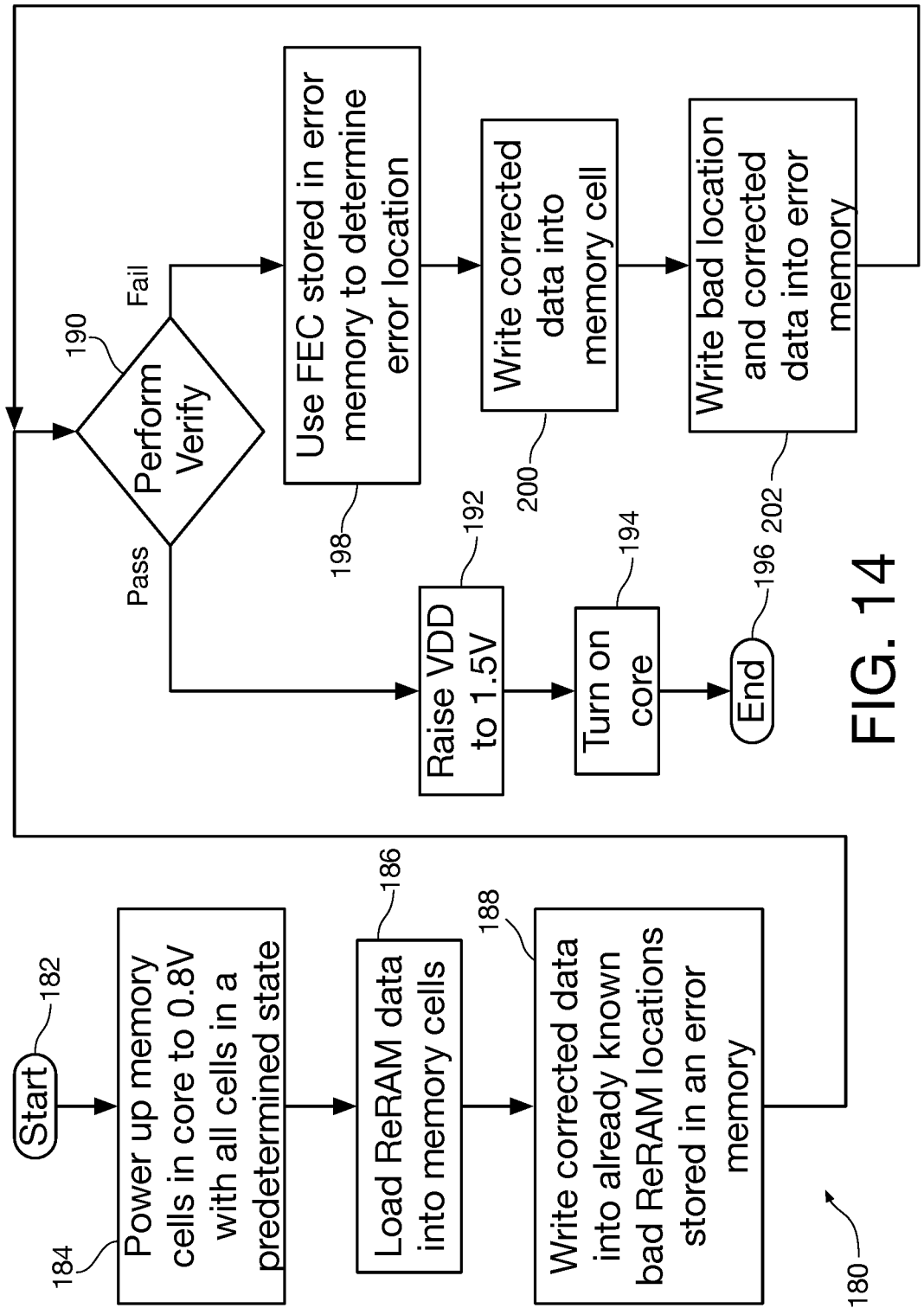
FIG. 14 is a flow diagram showing an illustrative method for operating the memory cells of the present invention.

Referring now to FIG. 14 a flow diagram shows an illustrative method 180 for operating the memory cells of the present invention. The method begins at reference numeral 182.

At reference numeral 184, upon power-up of the integrated circuit, the cross-coupled latches 52, 62, 72, 82 of the memory cells 50, 60, 70, or 80 are powered to 0.8V and set to a predetermined state. As indicated above this utilizes maximum voltage of 0.8V for the cross-coupled latches 52, 62, 72, 82 of the memory cells 50, 60, 70, or 80. Next, at reference numeral 186, the data in the ReRAMs in the PROMs associated with the memory cells is loaded into the memory cells 50, 60, 70, or 80 as described in relation to the table of FIG. 9.

Next, at reference numeral 188, corrected data is written into already-known bad locations (locations at which ReRAM based PROM cells have failed) in the memory using the operation described above in relation to FIG. 9 to write to selected latches. These already-known bad locations have been previously stored in an error memory either error memory 174 on-chip or an off-chip error memory that contains information identifying both the locations of failed ReRAM based PROM cells on the integrated circuit and the correct data. A verify operation is performed at reference numeral 190 to determine whether the memory cells 50, 60, 70, or 80 all contain correct data, or whether any additional ReRAM based PROM cells have failed. This verify operation is described above in relation to FIG. 9.

If the memory cells 50, 60, 70, or 80 all contain correct data, the method proceeds to reference numeral 192, where $V_{DD}$ is raised to 1.5V so as to enable operation, then to reference numeral 194, where the integrated circuit core is turned on. The method ends at reference numeral 196.

If all of the memory cells 50, 60, 70, or 80 do not contain correct data because one or more additional ReRAM based PROM cells have failed, the method proceeds to reference numeral 198, where a forward error correction (FEC) code (such as an ECC error code used in memory applications) stored in an on-chip or off-chip FEC storage memory (not shown) is used to determine the locations of the incorrect data. The controller 164 of FIG. 13 can perform the required FEC function required by this operation. At reference numeral 200, the correct data calculated from the FEC code is written into the cross-coupled latch of the memory cell as described above in relation to FIG. 9. Then at reference numeral 202, the location of the bad data and the corrected data are written into the error memory. The method returns to reference numeral 190, where a verify operation is again performed to determine whether the memory cells 50, 60, 70, or 80 all contain correct data. The loop through reference numerals 190 through 202 is performed until it is determined that all of the memory cells 50, 60, 70, or 80 contain correct data.

Referring now to FIGS. 15A and 15B, a schematic diagram of an exemplary series-connected pair of ReRAM devices 54 and 56 (FIG. 3) and a cross-sectional view of the ReRAM devices formed as a stack 210 implemented in silicon are shown respectively in accordance with an aspect of the invention. The stack 210 is shown formed on a first metal layer metal line 212. A first electrode 214 for the ReRAM device 54, formed from a material such as TiN or TaN is deposited over the metal line 212. In one embodiment of the invention this first electrode 214 may have a thickness in the range of 125 Å. A two-part switching layer (sometimes referred to as a solid electrolyte layer) formed from a layer 216a of a material such as tungsten (W) deposited over the first electrode 214 and a layer 216b of a material such as undoped amorphous Si deposited over the layer 216a. In one embodiment of the invention the layer 216a may have a thickness in the range of 50 A and layer 216b may have a thickness in the range of about 30 Å.

A second electrode 218 for both the ReRAM device 54 and the ReRAM device 56, formed from a material such as Al is deposited over the switching layer 216a/216b. In one embodiment of the invention this second electrode 218 may have a thickness for in the range of about 120 Å. A two-part switching layer for the ReRAM device 56 formed from a layer 220a of a material such as undoped amorphous Si is deposited over the second electrode 218 and a layer 220b formed from a material such as W is deposited over the layer 220a. In one embodiment of the invention this switching layer 220a may have a thickness in the range of about 30 A and the layer 220b may have a thickness in the range of about 50 Å. The W layer is used to make the interface layer between the Si layer 216b and first electrode 214 smooth, and it is believed to aid endurance. The W layer may be omitted from the switching layers for both of the ReRAM devices 54 and 56.

A first electrode 222 for the ReRAM device 54, formed from a material such as TiN or TaN is deposited over the switching layer 220b. In one embodiment of the invention this first electrode 222 may have a thickness in the range of 125 Å.

FIGS. 16A through 16F are cross-sectional views of the ReRAM stack 210 of FIG. 15B showing selected progressive fabrication steps used to manufacture it as part of a semiconductor fabrication process.

The process starts after the metal line 212 has been formed and defined using known deposition and etching techniques. The first electrode 214 for the ReRAM device 54 is deposited over the metal line 212 to a thickness, for example, in the range of 125 Å. The switching layer 216a (W) is then deposited over the first electrode 212 to thicknesses of, for example, in the range of 50 A and the layer 216b (amorphous Si) is formed over layer 216a to a thickness of, for example, in the range of about 30 Å.

The second electrode 218 for both the ReRAM device 54 and the ReRAM device 56, is then deposited over the switching layer 216b to a thickness of, for example, in the range of about 120 Å. A two-part switching layer for the ReRAM device 56 formed from a layer 220a of a material such as undoped amorphous Si is deposited over the second electrode 218 and a layer 220b formed from a material such as W is deposited over the layer 220a. In one embodiment of the invention this switching layer 220a may have a thickness in the range of about 30 A and the layer 220b may have a thickness in the range of about 50 Å. The W layer is used to make the interface layer between the Si and adjacent electrode smooth, and it is believed to aid endurance. The W layer may be omitted from the switching layers for both of the ReRAM devices 54 and 56.

Figure 16A:
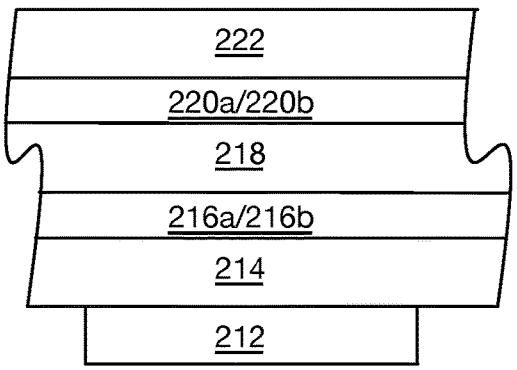

The first electrode 222 for the ReRAM device 54 is then deposited over the switching layer 220*b*, to a thickness of, for example, in the range of 125 Å. FIG. 16A shows the structure resulting after these processing steps have been performed.

Figure 16B:
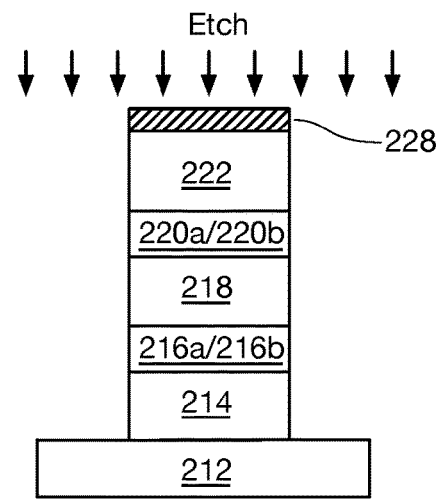

Referring now to FIG. 16B, a mask layer 228 is formed over the stack of layers 214, 216*a*/216*b*, 218, 220*a*/220*b*, and 222 and the stack is etched using metal line 212 as an etch stop to define the profile of the ReRAM devices 54 and 56. FIG. 16B shows the structure resulting after these processing steps have been performed.

Figure 16C:
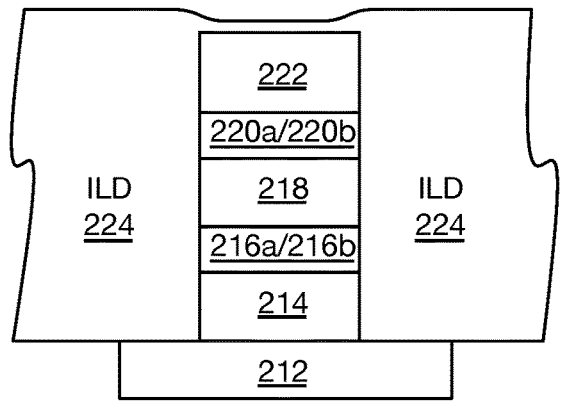

Referring now to FIG. 16C, an interlayer dielectric (ILD) 224 is deposited over the exposed surface of the structure shown in FIG. 16B to cover the entire stack of layers that form the ReRAM devices 54 and 56. FIG. 16C shows the structure resulting after this processing step has been performed.

Figure 16D:
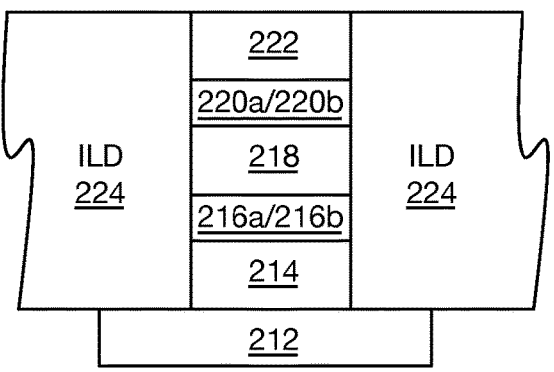

Referring now to FIG. 16D, the top surface of the ILD 224 is planarized using, for example, a CMP (chemical mechanical polishing) process to expose the top surface of the first electrode 222 for the ReRAM device 54. FIG. 16D shows the structure resulting after this processing step has been performed.

Figure 16E:
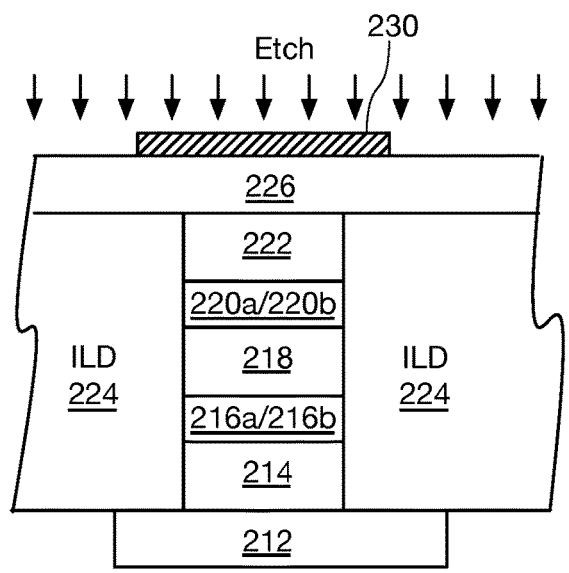

Referring now to FIG. 16E, a metal line 226 is deposited over the planarized surface of the ILD 224 making electrical contact with the first electrode 222. A mask layer 230 is formed over the planarized surface of the ILD 222 and the exposed portion of the first electrode 226 is etched away to define the metal line 226, using the ILD 224 as an etch stop. FIG. 16E shows the structure up to the performance of etching step.

Figure 16F:
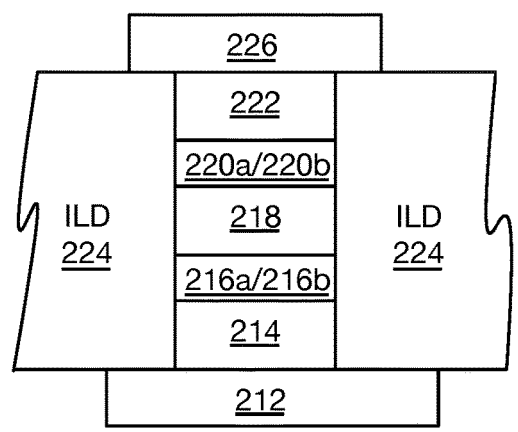

Referring now to FIG. 16F, the mask layer 230 has been removed to expose the defined metal line 226. FIG. 16F shows the finished ReRAM device stack structure. Conventional semiconductor processing back-end processing steps (not shown) are then performed to finish the integrated circuit containing the stacked ReRAM devices.

Persons of ordinary skill in the art will appreciate that the voltage and current values presented in FIG. 7 and in the table of FIG. 9, are representative values for illustrative memory cells according to the present invention and that these voltage values will vary according to individual integrated circuits employing different transistor designs and design rules. The bias current levels in any design are set so that during read operations the latch operates on sufficient current to prevent the read operation from disturbing the cell. Similarly, the bias current levels in any design are set so that during write operations the latch operates on a lower value of current to allow the writing source to overcome the existing latch state. These design parameters are well within the level of ordinary skill in the art.

While embodiments and applications of this invention have been shown and described, it would be apparent to those skilled in the art that many more modifications than mentioned above are possible without departing from the inventive concepts herein. The invention, therefore, is not to be restricted except in the spirit of the appended claims.

What is claimed is:

1. A single-event-upset (SEU) stabilized memory cell comprising:
   a first p-channel transistor coupled between a first voltage supply node and a first complementary output node;
   a first n-channel transistor coupled between the first complementary output node and a second voltage supply node;
   a second p-channel transistor coupled between the first voltage supply node and a second complementary output node, wherein gates of the first p-channel transistor and the first n-channel transistor are connected together and coupled to the second complementary output node; and
   a second n-channel transistor coupled between the second complementary output node and the second voltage supply node, wherein gates of the second p-channel transistor and the second n-channel transistor are connected together and coupled to the first complementary output node through a first series-connected pair of virgin resistive random-access memory (ReRAM) devices
   wherein one of the first and second complementary output nodes is coupled to a programmable read-only memory (PROM) cell that includes a programmable and erasable ReRAM device.

2. The SEU stabilized memory cell of claim 1 wherein the first series-connected pair of virgin ReRAM devices comprise a single vertical stack.

3. The SEU stabilized memory cell of claim 1, wherein;
   the memory cell is disposed in an array of memory cells;
   one of the first and second complementary output nodes is coupled to a bit line in the array through a select transistor, the select transistor having a gate coupled to a word line in the array; and
   the programmable and erasable ReRAM device is coupled to the one of the first and second complementary output nodes coupled to the bit line in the array through a PROM select transistor, a gate of the PROM select transistor coupled to a PROM word line in the array.

4. The SEU stabilized memory cell of claim 1 wherein the gates of the first p-channel transistor and the first n-channel transistor are coupled to the second complementary output node through a second series-connected pair of virgin ReRAM devices.

5. The SEU stabilized memory cell of claim 1, wherein:
   the first p-channel transistor is coupled to the first complementary output node through a first p-channel bias transistor;
   the first n-channel transistor is coupled to the first complementary output node through a first n-channel bias transistor;
   the second p-channel transistor is coupled to the second complementary output node through a second p-channel bias transistor; and
   the second n-channel transistor is coupled to the second complementary output node through a second n-channel bias transistor.

6. The SEU stabilized memory cell of claim 5, wherein:
   the first and second p-channel bias transistors have gates coupled to a Pbias line in an array; and
   the first and second n-channel bias transistors have gates coupled to a Nbias line in the array.

7. A single-event-upset (SEU) stabilized memory cell comprising:
   a first p-channel transistor coupled between a first voltage supply node and a first complementary output node;
   a first n-channel transistor coupled between the first complementary output node and a second voltage supply node;
   a second p-channel transistor coupled between the first voltage supply node and a second complementary output node, gates of the first p-channel transistor and the first n-channel transistor connected together and coupled to the second complementary output node;

a second n-channel transistor coupled between the second complementary output node and the second voltage supply node, gates of the second p-channel transistor and the second n-channel transistor connected together and coupled to the first complementary output node through a first series-connected pair of vertical resistors, wherein the first series-connected pair of vertical resistors is formed as a vertical stack that includes a first electrode for a first ReRAM device disposed over a metal segment of a first metallization layer in the integrated circuit, a switching layer for the first ReRAM device disposed over the first electrode for the first ReRAM device, a second electrode for both the first ReRAM device and a second ReRAM device disposed over the switching layer for the first ReRAM device, a switching layer for the second ReRAM device disposed over the second electrode for the first and second ReRAM devices, and a first electrode for the second ReRAM device disposed over the switching layer for the second ReRAM device.

8. The SEU stabilized memory cell of claim 7 wherein:
the switching layer for the first ReRAM device comprises two layers; and
the switching layer for the second ReRAM device comprises two layers.

9. The SEU stabilized memory cell of claim 7 wherein:
the two layers of the switching layer for the first ReRAM device comprise a first layer formed from tungsten and a second layer formed from amorphous silicon; and
the two layers of the switching layer for the second ReRAM device comprise a first layer formed from amorphous silicon and a second layer formed from tungsten.

10. The SEU stabilized memory cell of claim 7 wherein:
the first electrodes for the first and second ReRAM devices comprise one of TiN and TaN.

11. The SEU stabilized memory cell of claim 7 wherein:
the second electrode for both the first ReRAM device and a second ReRAM device comprises Al.

12. A single-event-upset (SEU) stabilized memory cell comprising:
a latch portion including a cross-coupled latch; and
at least one cross coupling circuit path in the latch portion including a first series-connected pair of vertical resistors formed as a vertical stack,
wherein the vertical stack comprises a first electrode for a first ReRAM device disposed over a metal segment of a first metallization layer in the integrated circuit, a switching layer for the first ReRAM device disposed over the first electrode for the first ReRAM device, a second electrode for both the first ReRAM device and a second ReRAM device disposed over the switching layer for the first ReRAM device, a switching layer for the second ReRAM device disposed over the second electrode for the first and second ReRAM devices, and a first electrode for the second ReRAM device disposed over the switching layer for the second ReRAM device.

13. The SEU stabilized memory cell of claim 12 wherein:
the switching layer for the first ReRAM device comprises two layers; and
the switching layer for the second ReRAM device comprises two layers.

14. The SEU stabilized memory cell of claim 12 wherein:
the two layers of the switching layer for the first ReRAM device comprise a first layer formed from tungsten and a second layer formed from amorphous silicon; and
the two layers of the switching layer for the second ReRAM device comprise a first layer formed from amorphous silicon and a second layer formed from tungsten.

15. The SEU stabilized memory cell of claim 12 wherein:
the first electrodes for the first and second ReRAM devices comprise one of TiN and TaN.

16. The SEU stabilized memory cell of claim 12 wherein:
the second electrode for both the first ReRAM device and a second ReRAM device comprises Al.

17. A method for operating an array of SEU stabilized memory cells in an integrated circuit, the method comprising:
applying power to the integrated circuit at a reduced supply voltage;
setting cross-coupled latches of the memory cells to an initial pre-determined state;
loading into the memory cells data from ReRAMs in PROMs associated with the memory cells;
writing corrected data from an error memory into already-known locations at which ReRAM based PROM cells have failed;
performing a verify operation to determine whether the memory cells all contain correct data;
if the memory cells all contain correct data, raising the supply voltage to an operating level and turning on a core of the integrated circuit;
if all of the memory cells do not contain correct data, using a forward error correction (FEC) code to determine locations of incorrect data;
writing correct data calculated from the FEC code into cross-coupled latches of memory cells identified as having incorrect data;
writing the location of the incorrect data and the corrected data into the error memory; and
re-performing a verify operation to determine whether the memory cells all contain correct data.

\* \* \* \* \*

UNITED STATES PATENT AND TRADEMARK OFFICE
CERTIFICATE OF CORRECTION

| | |
|---|---|
| PATENT NO. | : 11,031,078 B2 |
| APPLICATION NO. | : 16/363619 |
| DATED | : June 8, 2021 |
| INVENTOR(S) | : Fengliang Xue et al. |

It is certified that error appears in the above-identified patent and that said Letters Patent is hereby corrected as shown below:

In the Specification

Column 1, Line 48, replace "10M)" with --10MΩ--

Column 1, Line 49, replace "1G" with --1GΩ--

Column 10, Line 17, replace "1K)" with --1KΩ--

Column 10, Line 18, replace "10K)" with --10KΩ--

Signed and Sealed this
Twenty-sixth Day of October, 2021

Drew Hirshfeld
*Performing the Functions and Duties of the*
*Under Secretary of Commerce for Intellectual Property and*
*Director of the United States Patent and Trademark Office*